US012628428B2

(12) United States Patent
Mariani et al.

(10) Patent No.: US 12,628,428 B2
(45) Date of Patent: May 12, 2026

(54) ARRAY OF CAPACITORS, AN ARRAY OF MEMORY CELLS, METHOD USED IN FORMING AN ARRAY OF MEMORY CELLS, METHODS USED IN FORMING AN ARRAY OF CAPACITORS, AND METHODS USED IN FORMING A PLURALITY OF HORIZONTALLY-SPACED CONDUCTIVE LINES

(71) Applicant: Micron Technology, Inc., Boise, ID (US)

(72) Inventors: Marcello Mariani, Milan (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 366 days.

(21) Appl. No.: 18/228,782

(22) Filed: Aug. 1, 2023

(65) Prior Publication Data

US 2023/0378200 A1     Nov. 23, 2023

Related U.S. Application Data

(62) Division of application No. 17/680,644, filed on Feb. 25, 2022, now Pat. No. 11,764,234, which is a (Continued)

(51) Int. Cl.
| | |
|---|---|
| *H10D 86/80* | (2025.01) |
| *H10D 86/00* | (2025.01) |

(Continued)

(52) U.S. Cl.
CPC ............. *H10D 86/80* (2025.01); *H10D 86/01* (2025.01); *H10D 86/201* (2025.01); *H10B 69/00* (2023.02)

(58) Field of Classification Search
CPC .. H10B 12/0383; H10B 12/395; H10B 69/00; H10D 86/01; H10D 86/201; H10D 86/80
See application file for complete search history.

(56) References Cited

U.S. PATENT DOCUMENTS

| | | |
|---|---|---|
| 9,837,420 B1 | 12/2017 | Ramaswamy |
| 11,393,908 B1 | 7/2022 | Suresha et al. |

(Continued)

FOREIGN PATENT DOCUMENTS

| | | |
|---|---|---|
| WO | WO 2018/132249 | 7/2018 |

OTHER PUBLICATIONS

WO PCT/US2021/058432 IPRP, May 30, 2023, Micron Technology, Inc.

(Continued)

*Primary Examiner* — Nelson Garces
(74) *Attorney, Agent, or Firm* — Wells St. John P.S.

(57) ABSTRACT

A method used in forming an array of memory cells comprises forming a vertical stack comprising transistor material directly above insulator material. A mask is used to subtractively etch both the transistor material and thereafter the insulator material to form a plurality of pillars that individually comprise the transistor material and the insulator material. The insulator material is laterally-recessed from opposing lateral sides of individual of the pillars selectively relative to the transistor material of the individual pillars. The individual pillars are formed to comprise a first capacitor electrode that is in void space formed from the laterally recessing. Capacitors are formed that individually comprise the first capacitor electrode of the individual pillars. A capacitor insulator is aside the first capacitor electrode of the individual pillars and a second capacitor electrode is laterally-outward of the capacitor insulator. Vertical transistors are formed above the capacitors and individually comprise the transistor material of the individual pillars. Other aspects, including structure independent of method, are disclosed.

5 Claims, 26 Drawing Sheets

Related U.S. Application Data division of application No. 17/107,242, filed on Nov. 30, 2020, now Pat. No. 11,355,531.

(51) Int. Cl.
   *H10D 86/01* (2026.01)
   *H10B 69/00* (2023.01)

(56) References Cited

U.S. PATENT DOCUMENTS

| | | |
|---|---|---|
| 11,877,438 B2 | 1/2024 | Rigano |
| 2002/0017671 A1 | 2/2002 | Goebel et al. |
| 2005/0088895 A1 | 4/2005 | Manger et al. |
| 2005/0199932 A1 | 9/2005 | Abbott et al. |
| 2007/0051997 A1 | 3/2007 | Haller et al. |
| 2008/0099816 A1 | 5/2008 | Brown |
| 2010/0052029 A1 | 3/2010 | Huang |
| 2012/0037970 A1 | 2/2012 | Park et al. |
| 2018/0195049 A1* | 7/2018 | Ramaswamy ......... H10B 53/30 |
| 2019/0295941 A1* | 9/2019 | Ramaswamy ......... H10B 12/30 |
| 2022/0037342 A1 | 2/2022 | Simsek-Ege et al. |

OTHER PUBLICATIONS

WO PCT/US2021/058432 Search Rep, Mar. 2, 2022, Micron Technology, Inc.
WO PCT/US2021/058432 Writt. Opin., Mar. 2, 2022, Micron Technology, Inc.

* cited by examiner

ARRAY OF CAPACITORS, AN ARRAY OF MEMORY CELLS, METHOD USED IN FORMING AN ARRAY OF MEMORY CELLS, METHODS USED IN FORMING AN ARRAY OF CAPACITORS, AND METHODS USED IN FORMING A PLURALITY OF HORIZONTALLY-SPACED CONDUCTIVE LINES

RELATED PATENT DATA

This patent resulted from a divisional application of U.S. patent application Ser. No. 17/680,644, filed Feb. 25, 2022, entitled "An Array Of Capacitors, An Array Of Memory Cells, Method Used In Forming An Array Of Memory Cells, Methods Used In Forming An Array Of Capacitors, And Methods Used In Forming A Plurality Of Horizontally-Spaced Conductive Lines", naming Marcello Mariani and Giorgio Servalli as inventors, which was a divisional application of U.S. patent application Ser. No. 17/107,242, filed Nov. 30, 2020, entitled "An Array Of Capacitors, An Array Of Memory Cells, Method Used In Forming An Array Of Memory Cells, Methods Used In Forming An Array Of Capacitors, And Methods Used In Forming A Plurality Of Horizontally-Spaced Conductive Lines", naming Marcello Mariani and Giorgio Servalli as inventors, now U.S. Pat. No. 11,355,531, the disclosures of which are incorporated by reference.

TECHNICAL FIELD

Embodiments disclosed herein pertain to arrays of capacitors, to arrays of memory cells, to methods used in forming an array of memory cells, to methods used in forming an array of capacitors, and to methods used in forming a plurality of horizontally-spaced conductive lines.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. The gate insulator may be capable of being programmed between at least two retentive capacitive states whereby the transistor is non-volatile. Alternately, the gate insulator may not be so capable whereby the transistor is volatile. Regardless, field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as a charge may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, in such instances, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry and fabricated into arrays that may or may not be at least part of a memory array.

DETAILED DESCRIPTION OF EXAMPLE EMBODIMENTS

Embodiments of the invention include methods used in forming an array of capacitors, for example as may be used in memory or other integrated circuitry. Embodiments of the invention also encompass methods used in forming an array of memory cells, for example comprising a plurality of vertical transistors that are above a plurality of capacitors. Embodiments of the invention also encompass methods used in forming a plurality of horizontally-spaced conductive lines. Embodiments of the invention also encompass an array of capacitors and an array of memory cells independent of method of manufacture. Example embodiments of methods of forming an array of memory cells are first described with reference to FIGS. 1-16.

Figure 1:
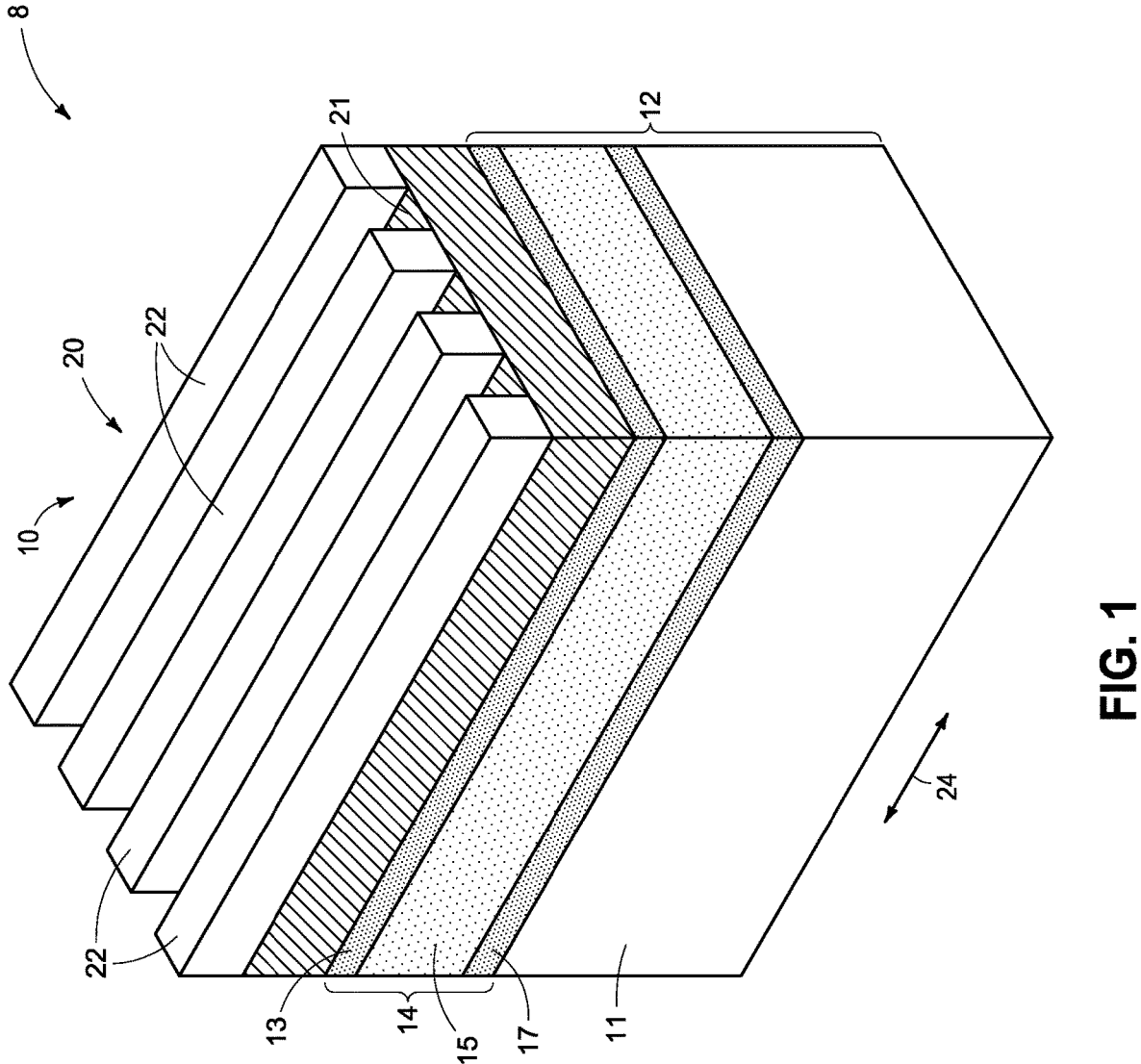
FIG. 1 is a diagrammatic perspective view of a portion of a substrate in process in accordance with an embodiment of the invention.

Referring to FIG. 1, such shows an example substrate construction 8 comprising an array or array area 10. Such may be fabricated relative to a base substrate (not show) that may comprise any of conductive/conductor/conducting, semiconductive/semiconductor/semiconducting, and insulative/insulator/insulating (i.e., electrically herein) materials. Materials may be aside, elevationally inward, or elevationally outward of the FIG. 1-depicted materials. For example, other partially or wholly fabricated components of integrated circuitry may be provided somewhere above, about, or within a base substrate (not shown). Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Construction 8 comprises an example vertical stack 12 comprising transistor material 14 directly above insulator material 11 (e.g., silicon dioxide and/or silicon nitride). Transistor material 14 in one embodiment comprises top source/drain region material 13 directly above channel region material 15, and in one such embodiment comprises bottom source/drain region material 17 directly under channel region material 15. By way of examples only, materials 13, 15, and 17 may comprise one or more of appropriately-doped crystalline semiconductor material, such as one or more of silicon, germanium, and so-called III/V semiconductor materials (e.g., GaAs, InP, GaP, and GaN), with source/drain region materials 13 and 17 being sufficiently doped to be conductive and channel region material 15 being undoped or sufficiently doped to be semiconductive to conduct in an "on" state and to not conduct in an "off" state of the vertical transistors being formed. In one embodiment, conductive material 21 (e.g., metal material such as tungsten and/or TiN) has been formed above vertical stack 12. Such may provide better ohmic contact between digitlines (not-yet-shown) and top source/drain region material 13.

A mask 20 comprising mask lines 22 is above vertical stack 12 (and conductive material 21 when present). Mask lines 22 extend along a column direction 24, for example, along which digitlines (not-yet-shown) will be formed. Mask 20 may be considered as a first mask 20 in comparison to an example second mask (not-yet-shown) described below and may be sacrificial (e.g., comprising photoresist). Masks formed herein may be formed using pitch multiplication.

Figure 2:
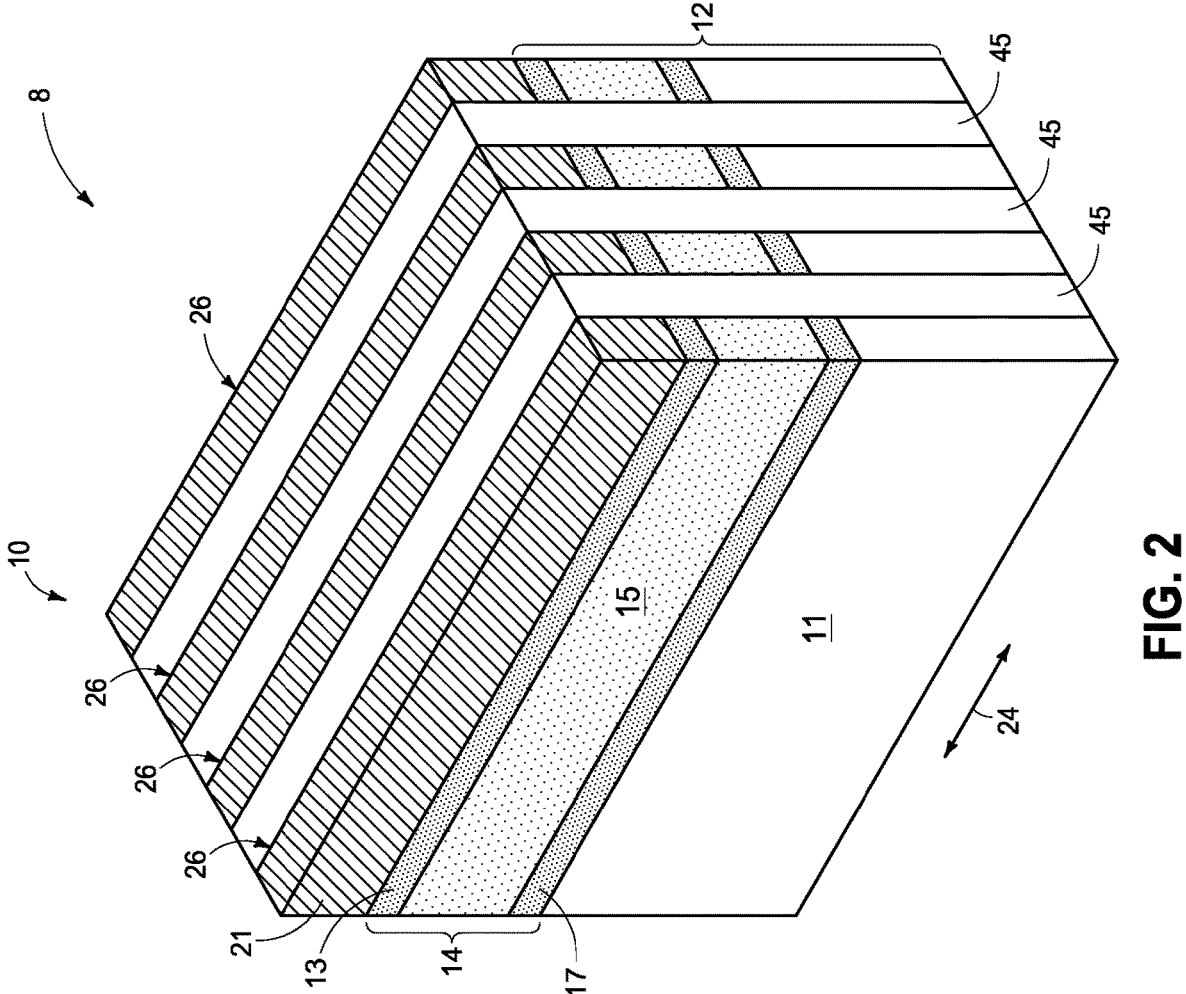
FIGS. 2-26 are diagrammatic sequential sectional, expanded, enlarged, perspective, and/or partial views of the construction of FIG. 1, or portions thereof, or partial hybrid schematics or partial schematics thereof, and/or alternate embodiments in process in accordance with some embodiments of the invention.

Referring to FIG. 2, and in one embodiment, first mask 20 (not shown) has been used to subtractively etch (e.g., anisotropically) both transistor material 14 and thereafter insulator material 11 to form a plurality of walls 26 that are horizontally-elongated in column direction 24 and that individually comprise transistor material 14 and insulator material 11 (e.g., in an etching step using first mask 20 in a single common masking step for the etching of materials 14 and 11 as shown). The processing shown by FIG. 2 may cause walls 26 to be tapered (not shown) whereby the sides of walls 26 are not vertical, for example being wider at their bottoms than at their tops (not shown). FIG. 2 shows filling of space between walls 26 with insulator material 45 (e.g., silicon dioxide and/or silicon nitride and of different composition from that of insulator material 11).

Figure 3:
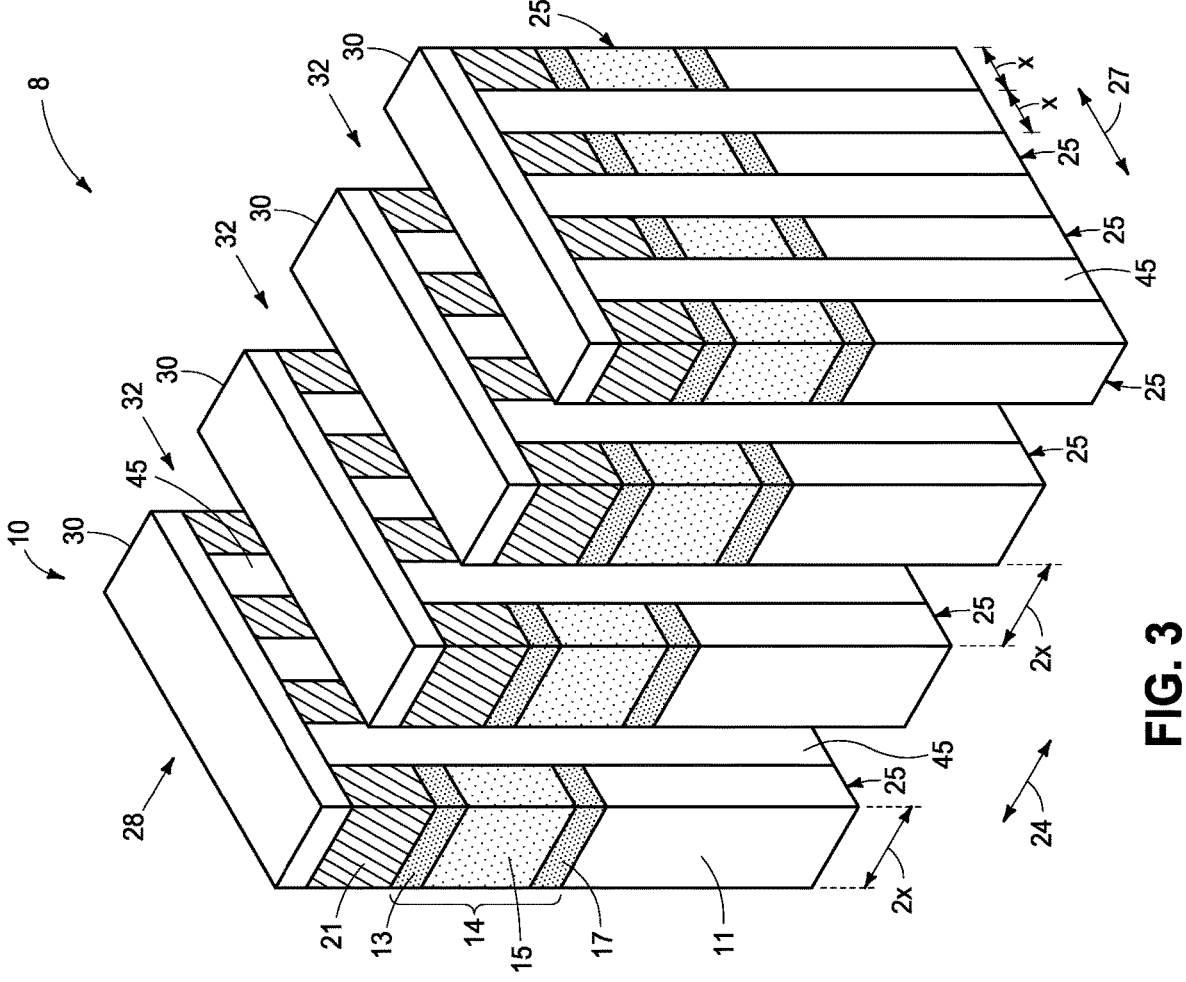

Referring to FIG. 3, a mask 28 (e.g., a second mask 28) has been formed after the forming of first mask 20 (not shown) and comprises mask lines 30 that extend along a row direction 27 in which, in one embodiment, gate lines (not-yet-shown) of vertical transistors will be formed. Thereafter, mask 28 has been used to subtractively etch (e.g., anisotropically) both transistor material 14 and thereafter insulator material 11 of walls 26 (and materials 45 and 21 when present) to form a plurality of pillars 25 individually comprising transistor material 14 and insulator material 11. In one embodiment and as shown, such has also formed a plurality of trenches 32 that are individually longitudinally-elongated in and extend along row direction 27. The processing shown by FIG. 3 may cause pillars 25 to be tapered (not shown) whereby the sides of pillars 25 are not vertical, for example being wider at their bottoms than at their tops (not shown). In one embodiment and as shown, horizontal width of pillars 25 and spacing there-between are the same in column direction 24 (e.g., a dimension "X" [16 nm] for each). Further, in one embodiment and as shown, horizontal width of pillars 25 and spacing there-between are the same in row direction 27, and which in one such embodiment is greater than that in column direction 24 (e.g., "2X" [32 nm] for each). Alternate x/y-axis layout(s) and/or spacing(s) may be used. Further and regardless, and by way of examples only, spacing between pillars 25 in one or both of directions 24 and 27 may be less at the tops and/or bottoms 25 (not shown).

The above processing is but one example of using a mask (e.g., 28) to subtractively etch both transistor material 14 and thereafter insulator material 11 to form a plurality of pillars 25 that individually comprise transistor material 14 and insulator material 11 (e.g., in an etching step using mask 28 in a single common masking step for the etching of materials 14 and 11, and regardless of whether an earlier mask [e.g., 20] was used). Alternately, only a single mask may be used to form pillars 25 (not shown and less ideal).

Figure 4:
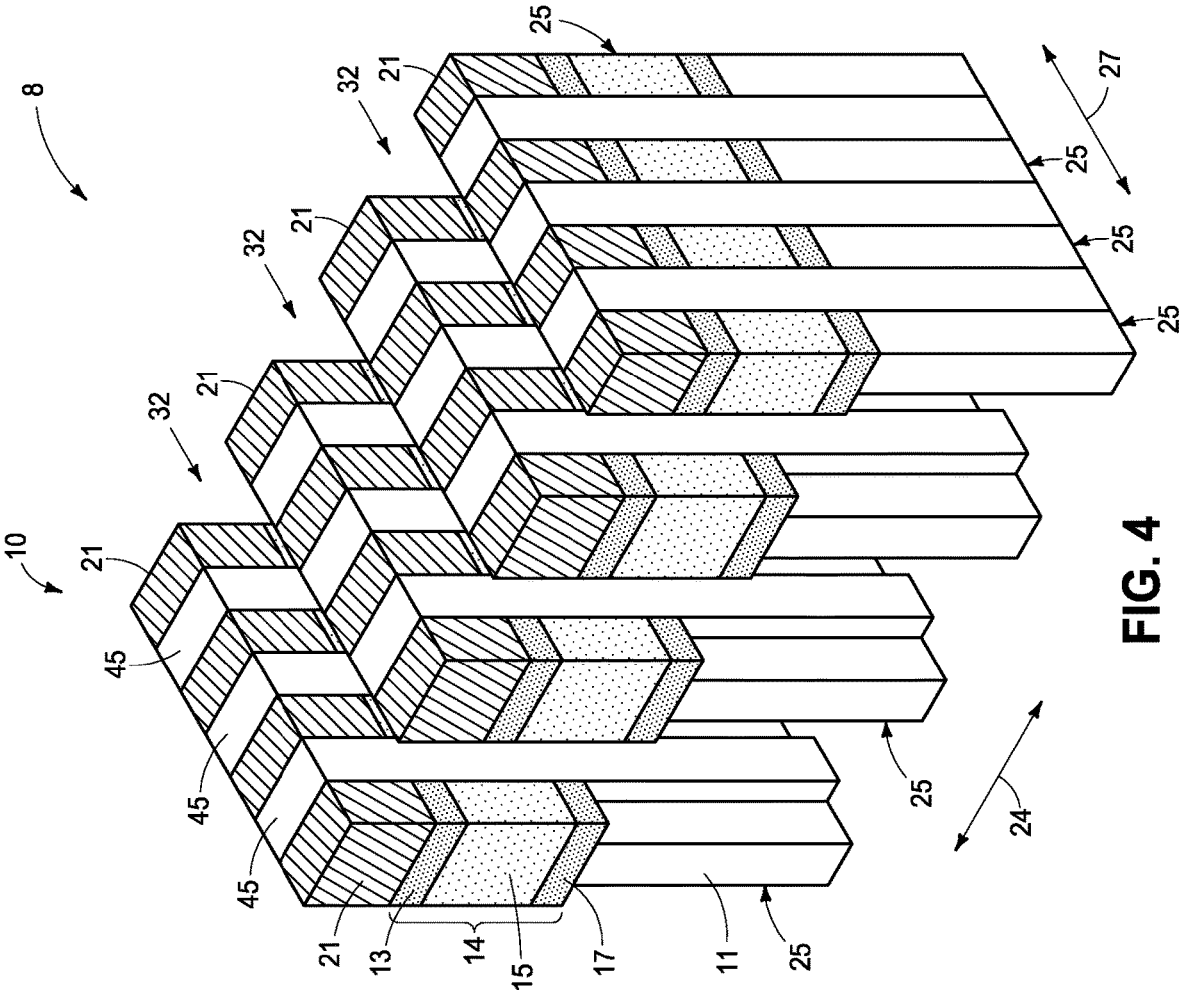

Referring to FIG. 4, mask 28 (not shown) has been removed and insulator material 11 has been laterally recessed from opposing lateral sides (e.g., in direction 24) of individual pillars 25 (e.g., by isotropic etching) selectively relative to transistor material 14 of individual pillars 25 (e.g., and selectively relative to other depicted materials in one embodiment). The artisan is capable selecting suitable such isotropic etching chemistries. For example, and by way of example only, where insulator material 11 is silicon dioxide, material 45 is silicon nitride, material 21 is metal material, and materials 13/15/17 are polysilicon, a solution of 100:1 (by volume) water to HF may be used to produce the construction shown by FIG. 4 from that of FIG. 3. An example quantity of lateral recessing of insulator material 11 on/from each side is one-eighth of the direction 24-width of individual pillars 25.

Figure 5:
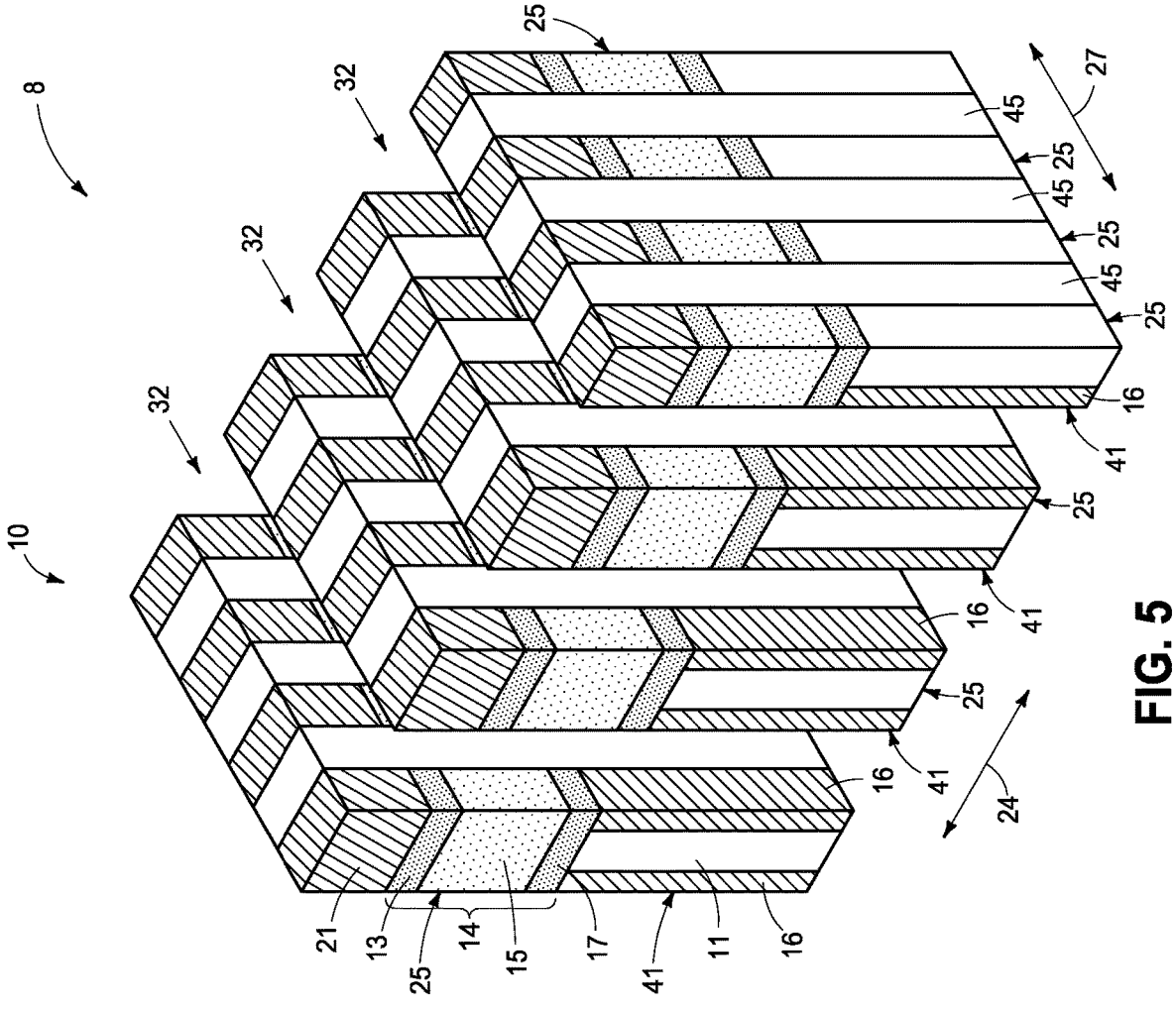

Referring to FIG. 5, individual pillars 25 have been formed to comprise a first capacitor electrode 41 that is in void space that was formed from the laterally-recessing shown by FIG. 4. An example technique of forming the construction of FIG. 5 includes deposition of a first capacitor electrode material 16 sufficient to fill such void space but insufficient to completely fill all space between former pillars 25 and insulator material 45 along direction 27. First capacitor electrode material 16 comprises one or more conductive materials (intrinsic electrical resistance of 0.0001 to 1.0 ohm·cm), for example elemental tungsten atop conductively-doped polysilicon or atop additional metal material other than elemental tungsten. Thereafter, first capacitor electrode material 16 may be isotropically etched in a timed manner to produce the depicted FIG. 5 construction. Alternately, first capacitor electrode material 16 may be selectively grown from insulator material 11. Accordingly, in either and in one embodiment, formation of first capacitor electrodes 41 has occurred in a self-aligned manner, for example relative to sidewalls of both insulator material 11 and insulator material 45 formed as a result of the act of laterally recessing shown and described with respect to FIG. 4.

Figure 6:
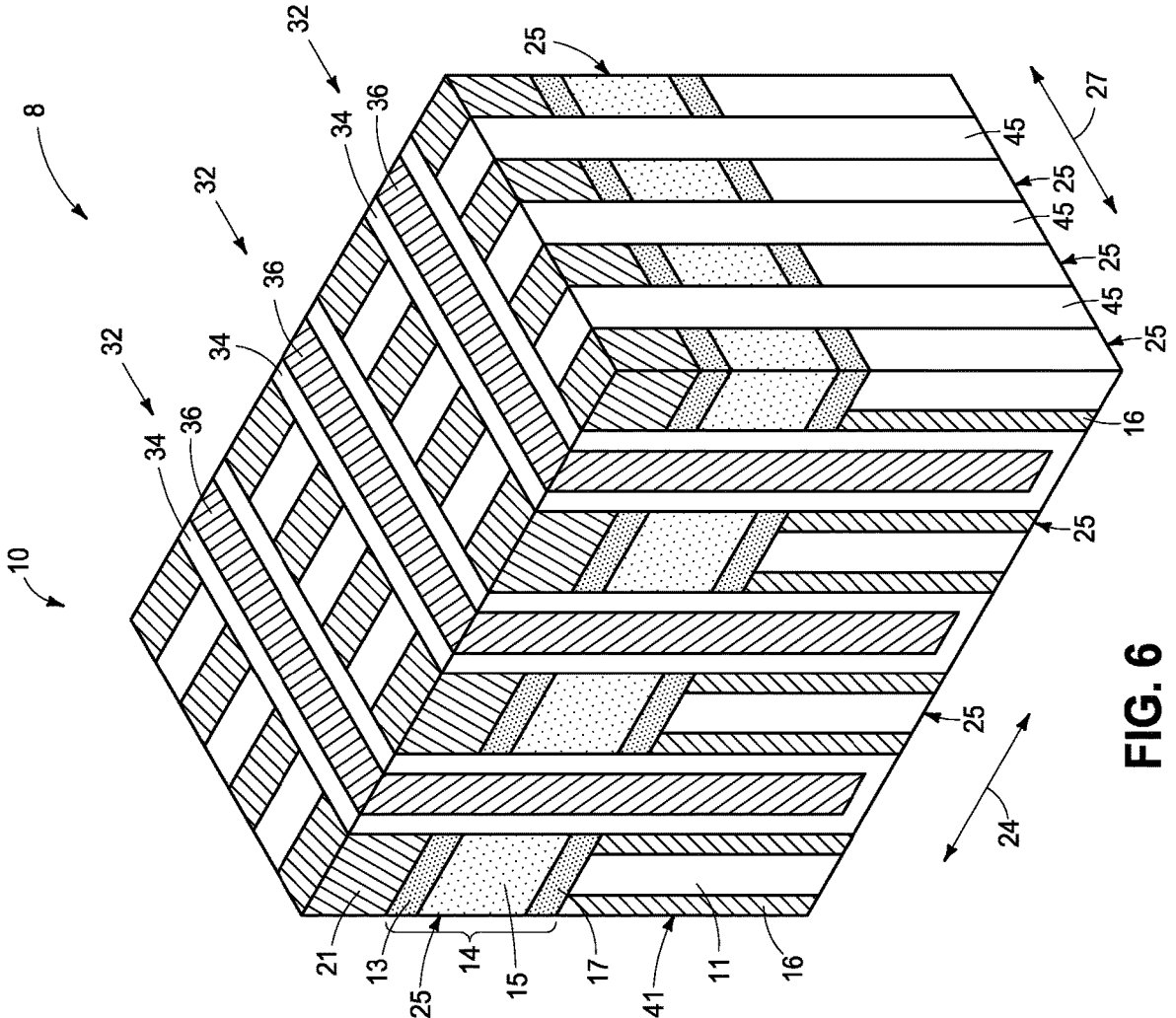

Referring to FIG. 6, a capacitor insulator 34 (e.g., silicon dioxide, silicon nitride, high-k material, and/or ferroelectric material) has been formed aside first capacitor electrodes 41 of pillars 25. A second capacitor electrode material 36 has been formed laterally-outward of capacitor insulator 34. Second capacitor electrode material 36 and first capacitor electrode material 16 may be of the same composition or of different compositions relative one another. Such may be deposited to collectively line and overfill trenches 32 along direction 27 followed by planarizing such back at least to tops of conductive material 21 (e.g., when present).

Figure 7:
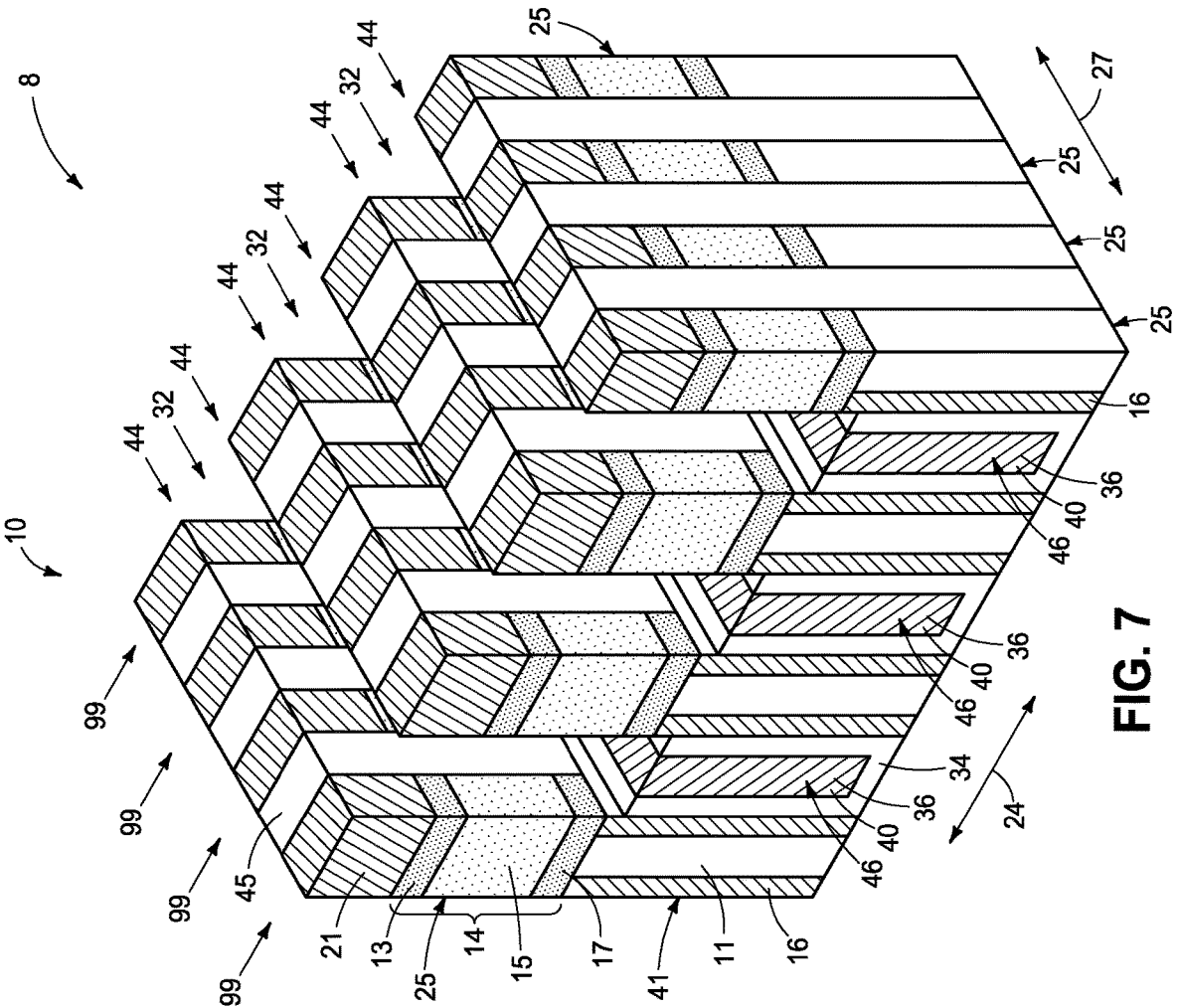
Figure 8:
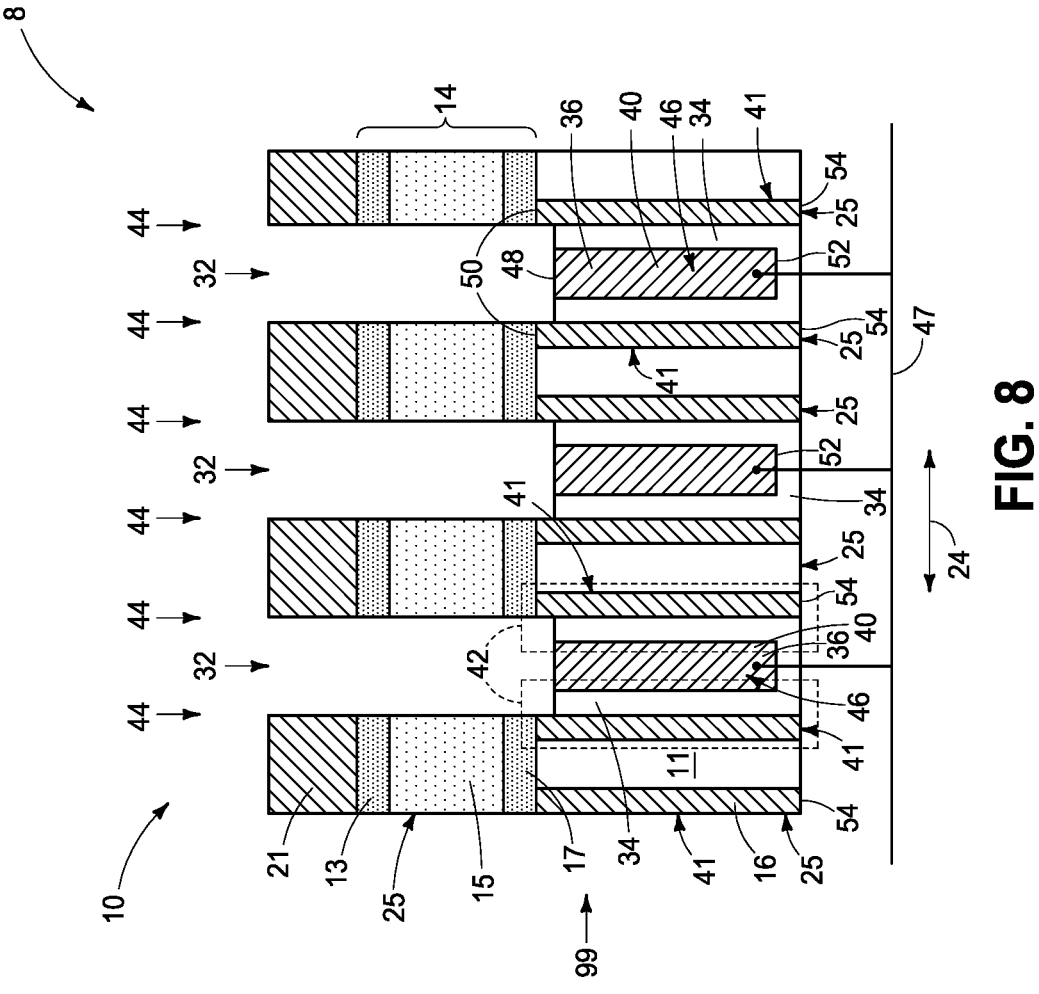

Referring to FIGS. 7 and 8, such shows vertical recessing (e.g., by etching) of second capacitor electrode material 36 (and in one embodiment also capacitor insulator 34) to form, in one embodiment, conductive lines 46 that are individually longitudinally-elongated horizontally and extend alongside and are directly against capacitor insulator 34. Individual conductive lines 46 comprise a second capacitor electrode 40 of individual capacitors 42 (FIG. 8) that have been formed. In one embodiment and as shown, individual conductive lines 46 comprise a shared second capacitor electrode 40 of immediately-row-adjacent capacitors 42 and interconnect individual second capacitor electrodes 40 longitudinally along immediately-adjacent rows 44 of capacitors 42 (along individual conductive lines 46). In some embodiments, capacitors 42 may be considered as being arrayed in columns 99. In one embodiment, conductive lines 46 have tops 48 that are below tops 50 of first capacitor electrodes 41. In one embodiment, conductive lines 46 have bottoms 52 that are above bottoms 54 of first capacitor electrodes 41. In one embodiment, conductive lines 46 are directly electrically coupled together, for example as is schematically shown by an interconnect line 47 whereby, for example, second capacitor electrodes 40 are common to all capacitors 42 within array 10. Such interconnection may occur during, earlier, or later in the example processing shown by FIGS. 7 and 8.

The above processing is but one example of forming capacitors (e.g., 42) individually comprising a first capacitor electrode (e.g., 41) of the individual pillars (e.g., 25), a capacitor insulator (e.g., 34) aside the first capacitor electrode of the individual pillars, and a second capacitor electrode (e.g., 40) laterally-outward of the capacitor insulator. Other and/or additional processing may be used.

Vertical transistors are formed above the capacitors and that individually comprise the transistor material of the individual pillars. An example method of doing so is next described with reference to FIGS. 9-13. In such example embodiment, pillars 25 may be considered as first pillars 25.

Figure 9:
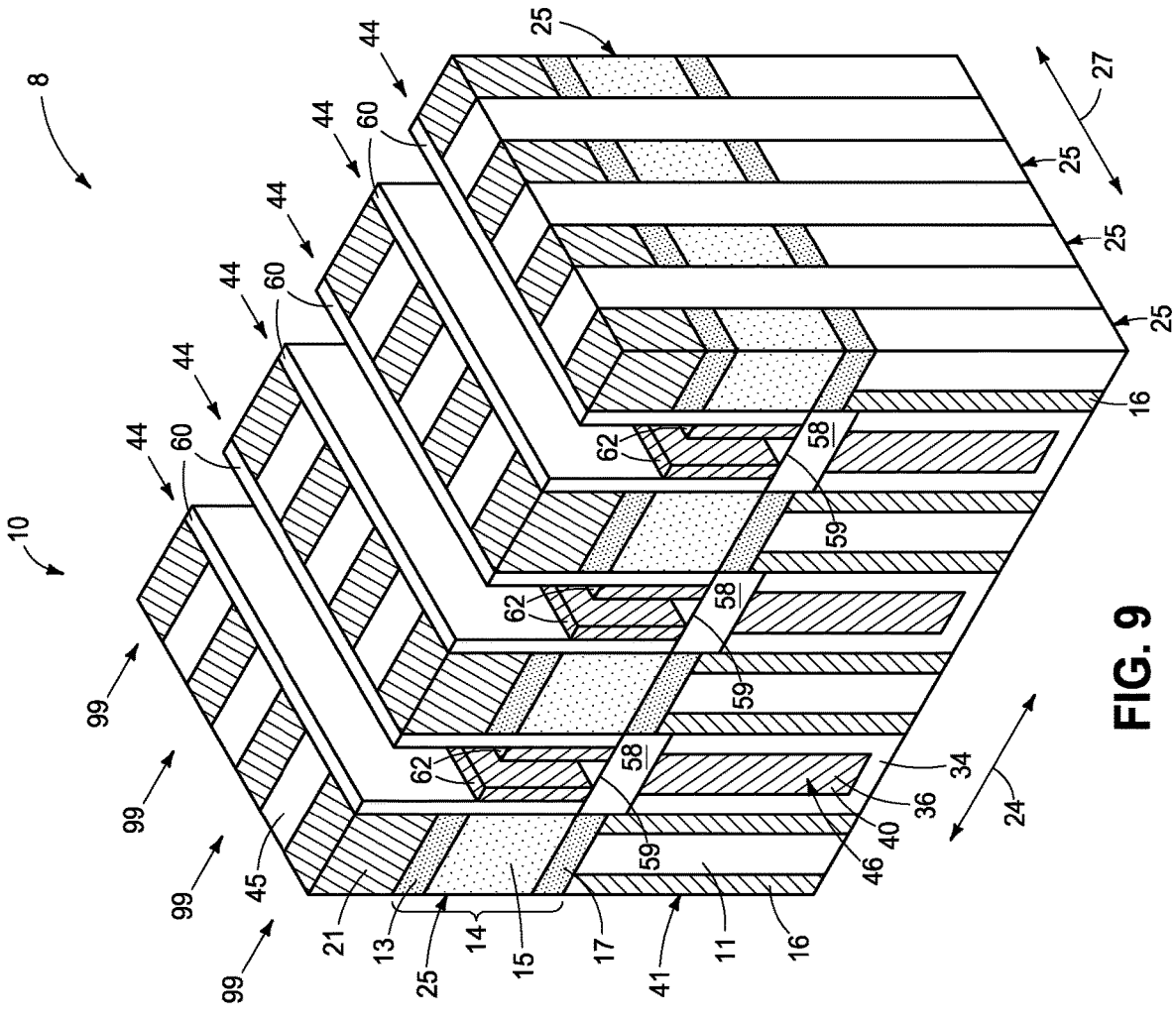
Figure 10:
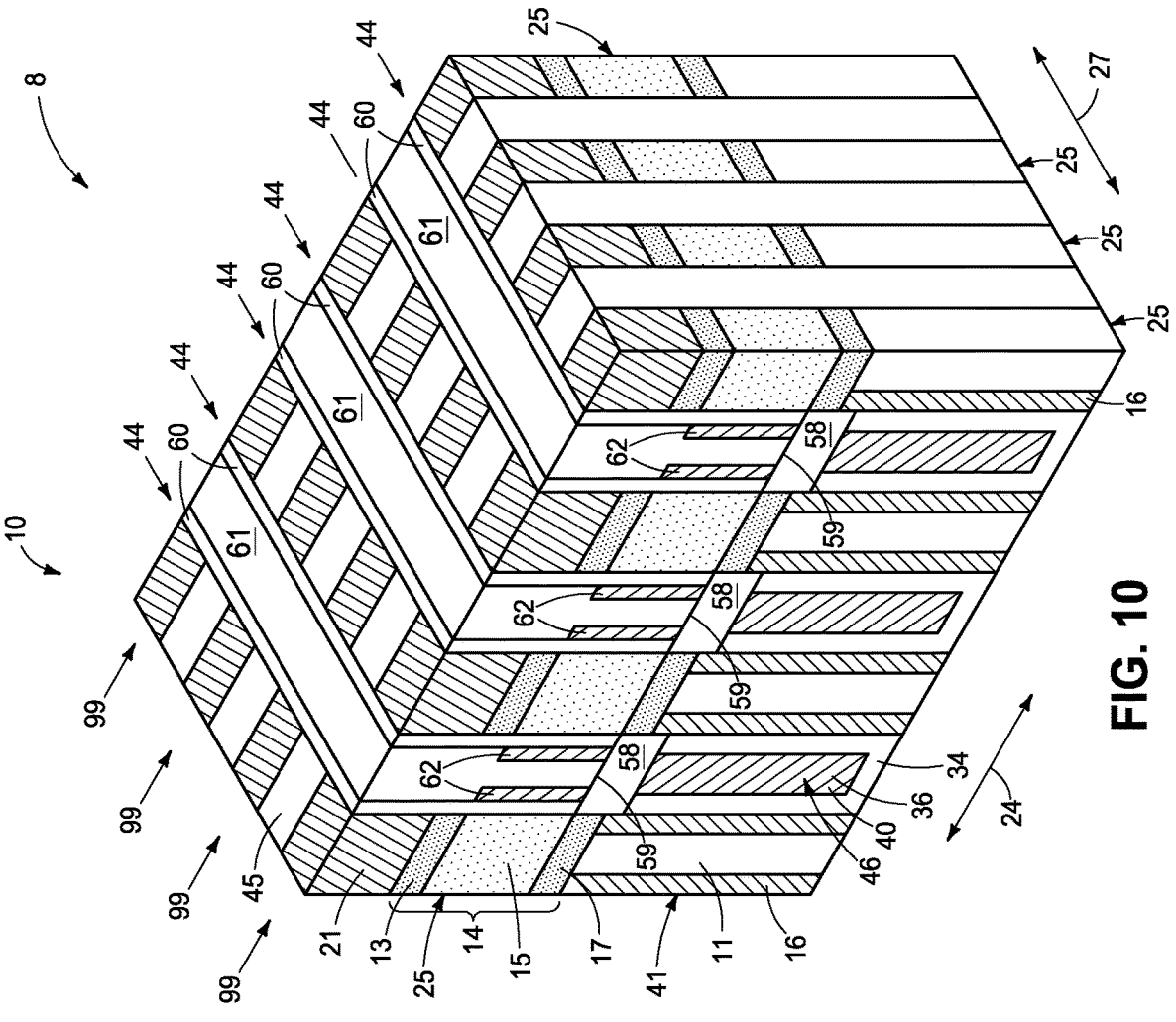

Referring to FIG. 9, insulator material 58 (e.g., silicon dioxide and/or silicon nitride) has been formed atop conductive lines 46 and capacitor insulator 34. Such has a top surface 59 that has been used at least in part to define a bottom of a plurality of gate lines 62 that has been formed there-above (and above conductive lines 46). For example, FIG. 9 shows formation of a gate insulator 60 followed by formation of gate lines 62 that extend along row direction 27. By way of example only, gate insulator 60 may be formed by a conformal deposition followed by an anisotropic spacer-like etch thereof, followed by deposition of conductive material for gate lines 62, and followed by an anisotropic spacer-like etch thereof. Alternately, as an example, gate insulator 60 might not be subjected to an anisotropic spacer-like etch prior to forming the conductive material of gate lines 62 (not shown). Such are but a couple of examples of forming a plurality of gate lines 62 above conductive lines 46 and extending along row direction 27. FIG. 10 shows example filling of remaining volume between gate lines 62 and gate insulator 60 with insulator material 61 (e.g., silicon dioxide and/or silicon nitride).

Figure 11:
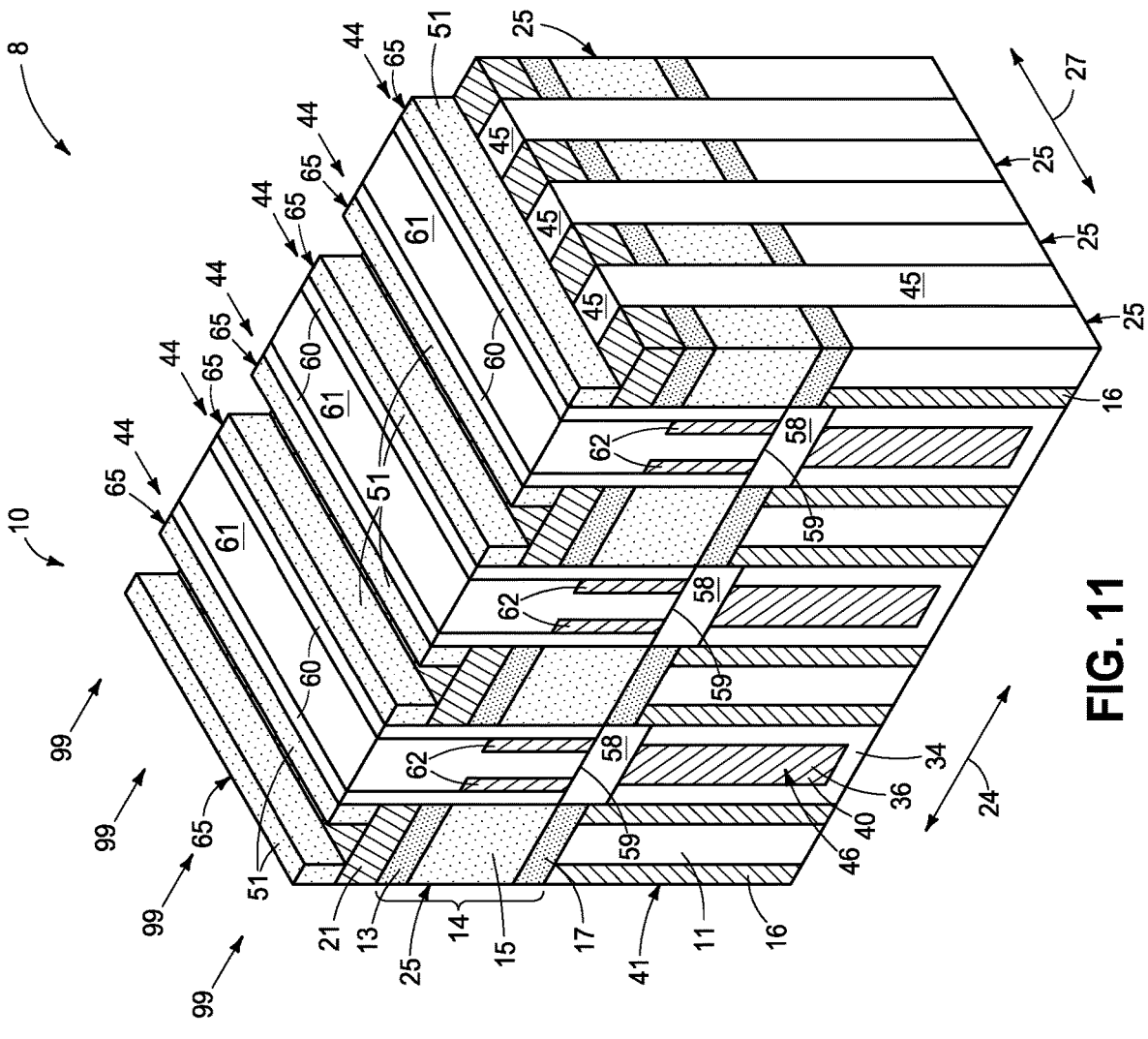

Referring to FIG. 11, and in one embodiment, conductive material 21 has been vertically recessed relative to gate insulator 60 and insulator material 61. Thereafter, a conformal layer of material 51 (e.g., SiOC or SiC) has been deposited to less-than-fill void space resulting from the vertical recessing, followed by subjecting it to a spacer-like etch to form sidewall-spacer lines 65 in such void space.

Figure 12:
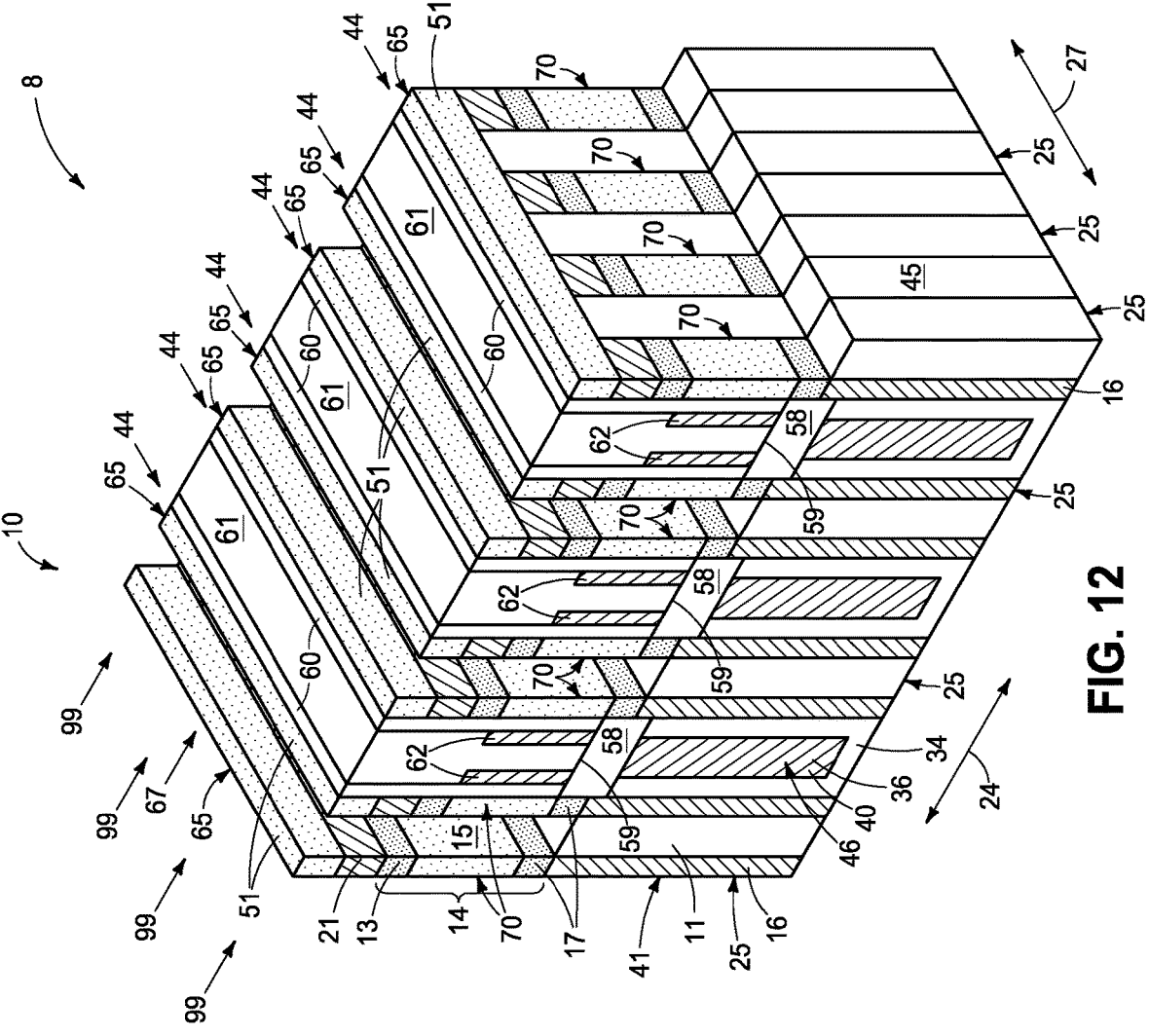
Figure 13:
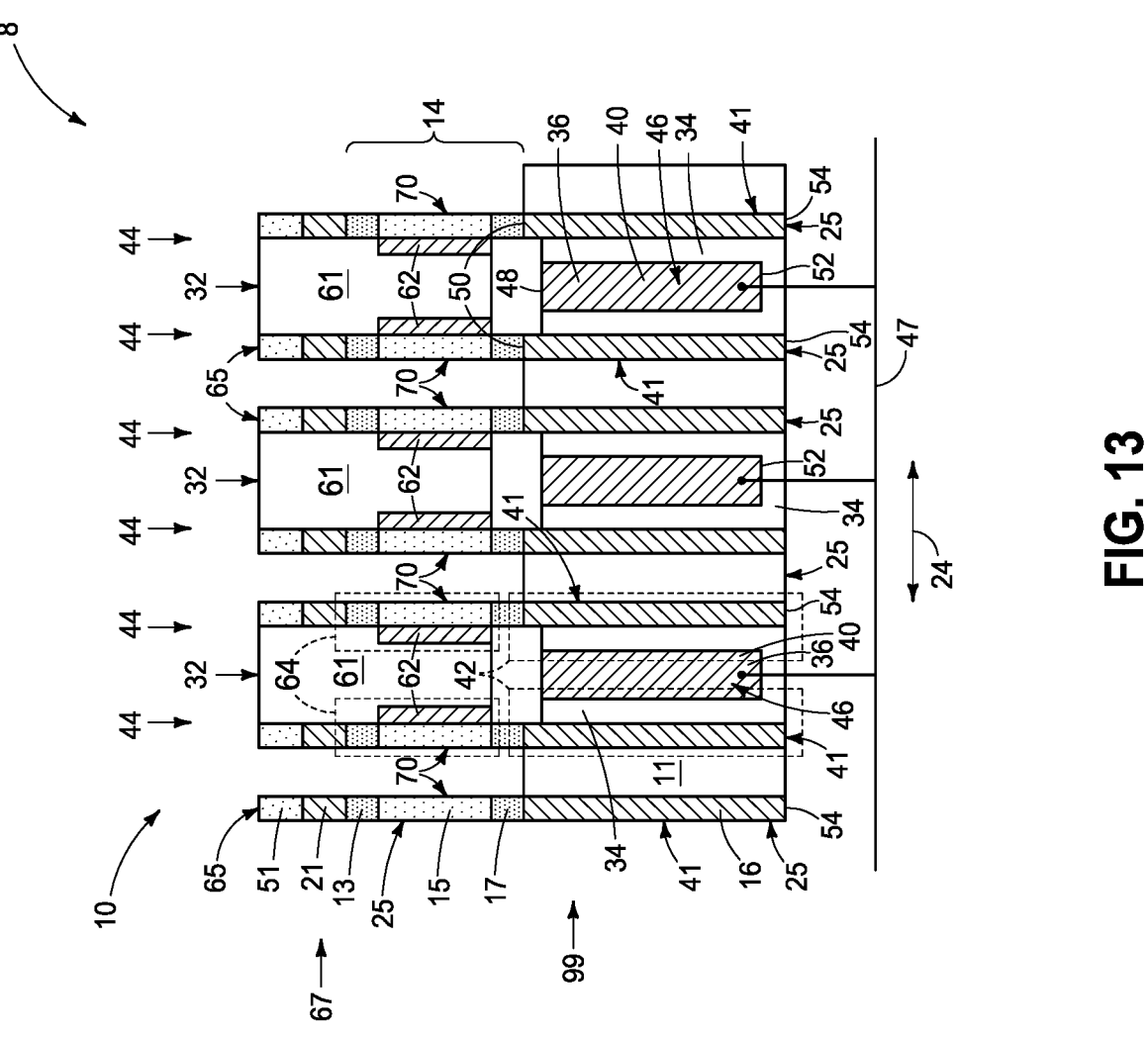

Referring to FIGS. 12 and 13, sidewall-spacer lines 65 and materials 34/61 have been used to comprise a mask 67 while etching first pillars 25 to bifurcate them into two second pillars 70 comprising transistor material 14 that are above a single one of first pillars 25. Such single one of first pillars 25 comprise two first capacitor electrodes 41 of two immediately-laterally-adjacent capacitors 42 having insulator material 11 laterally-between said two first capacitor electrodes 41. Gate lines 62 individually are operatively laterally-proximate channel regions of transistor material 14 of pillars 70/25 (e.g., defined by channel region material 15), with transistor material 14 of individual pillars 70/25 and its laterally-proximate gate line 62 comprising a vertical transistor 64.

Figure 14:
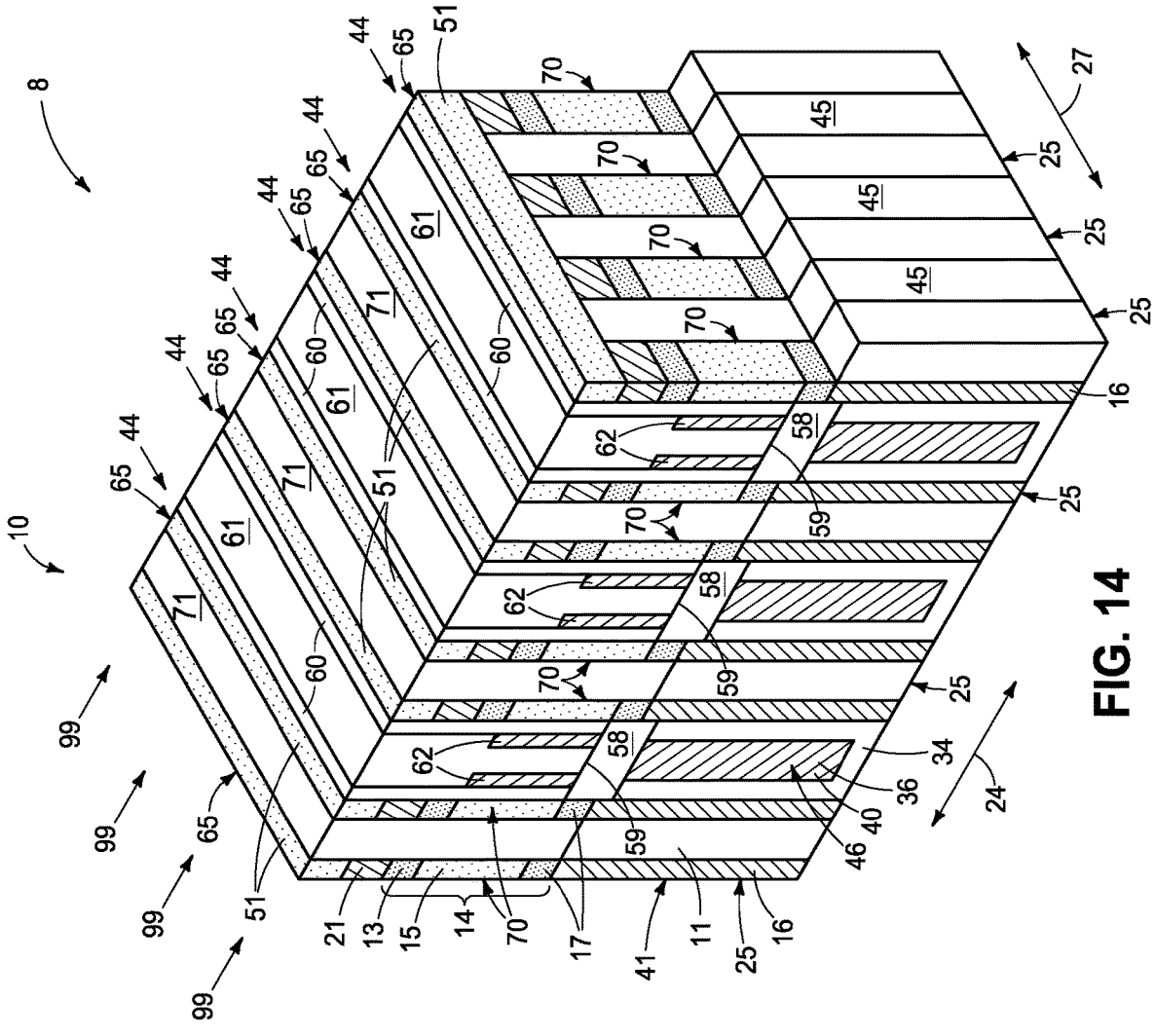

FIG. 14 shows filling of void space left by the act of bifurcating with insulating material 71 (e.g., silicon dioxide and/or silicon nitride).

Figure 15:
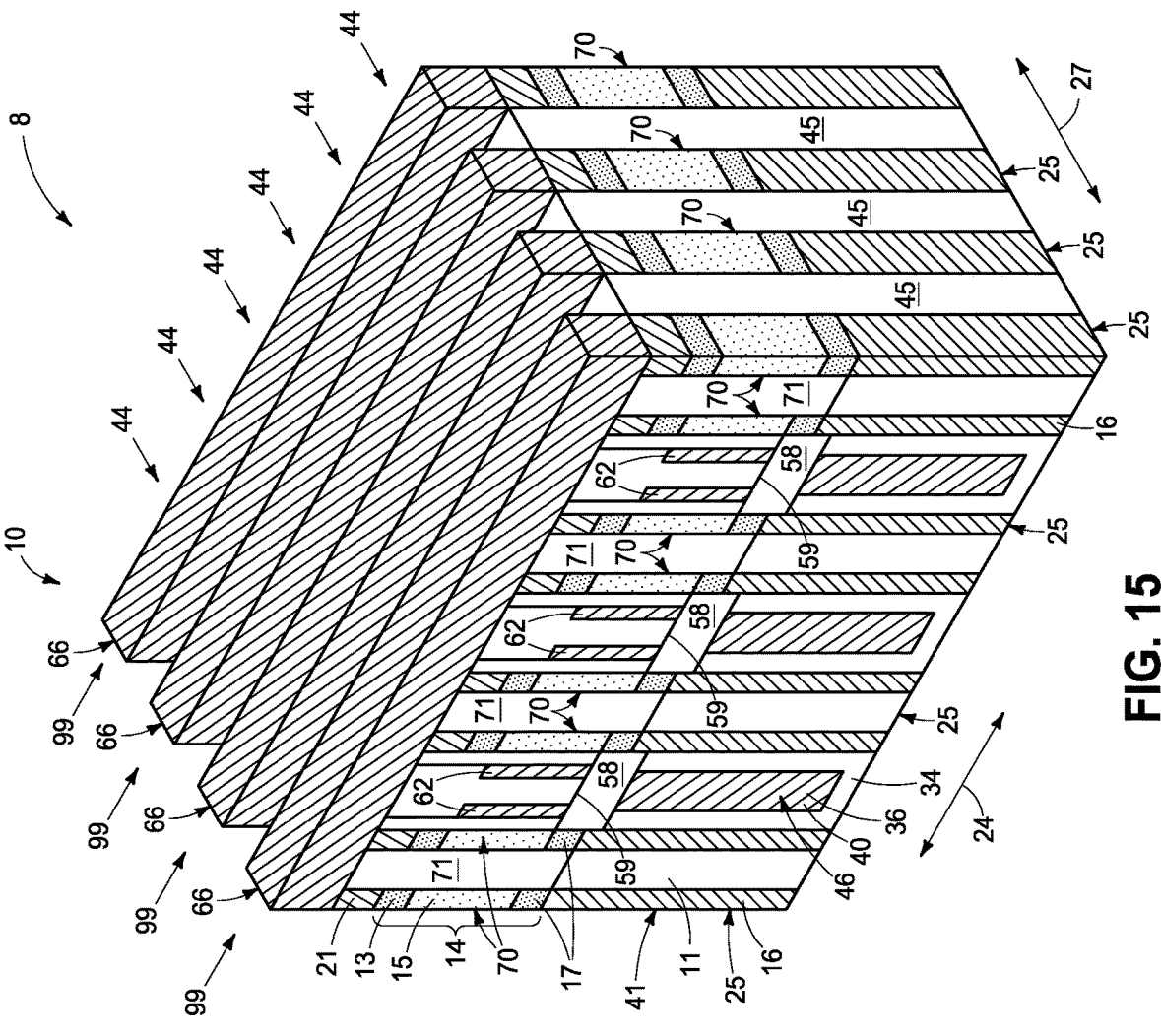
Figure 16:
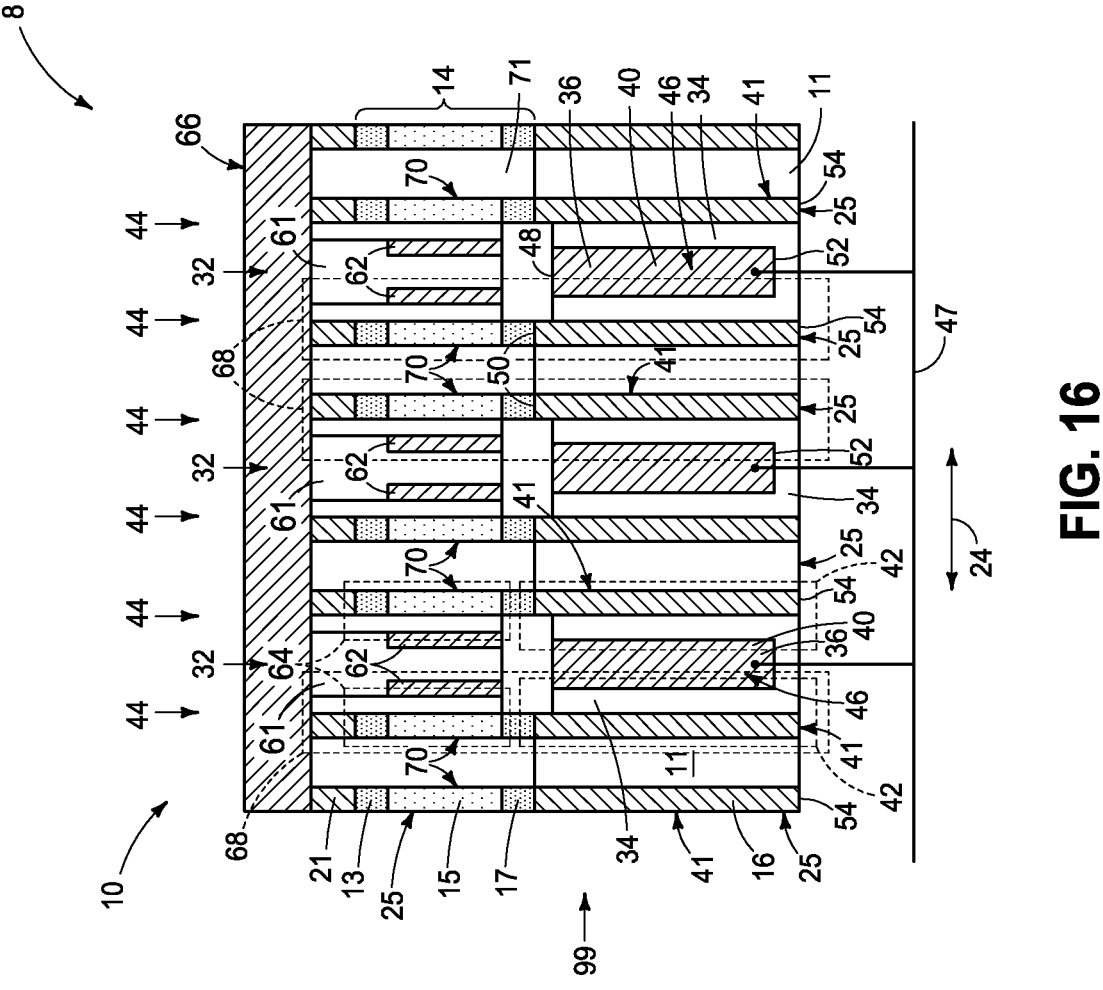

FIGS. 15 and 16 show formation of a plurality of digitlines 66 that are individually above gate lines 62 and extend along column direction 24 in columns 99. Digitlines 66 individually are electrically coupled (e.g., directly electrically coupled) to individual vertical transistor 64 (e.g., to individual top source/drain regions 13, with material 51 (not shown) and material 71 having been planarized back to upwardly expose conductive material 21 [when present] prior to forming digitlines 66). An array 10 of memory cells 68 has thereby been formed with, in one embodiment, memory cells 68 individually comprising a single vertical transistor 64 and a single capacitor 42 (a 1T-1C memory cell).

Any other attribute(s) or aspect(s) as shown and/or described herein with respect to other embodiments may be used in the embodiments shown and described with reference to the above embodiments.

Figure 17:
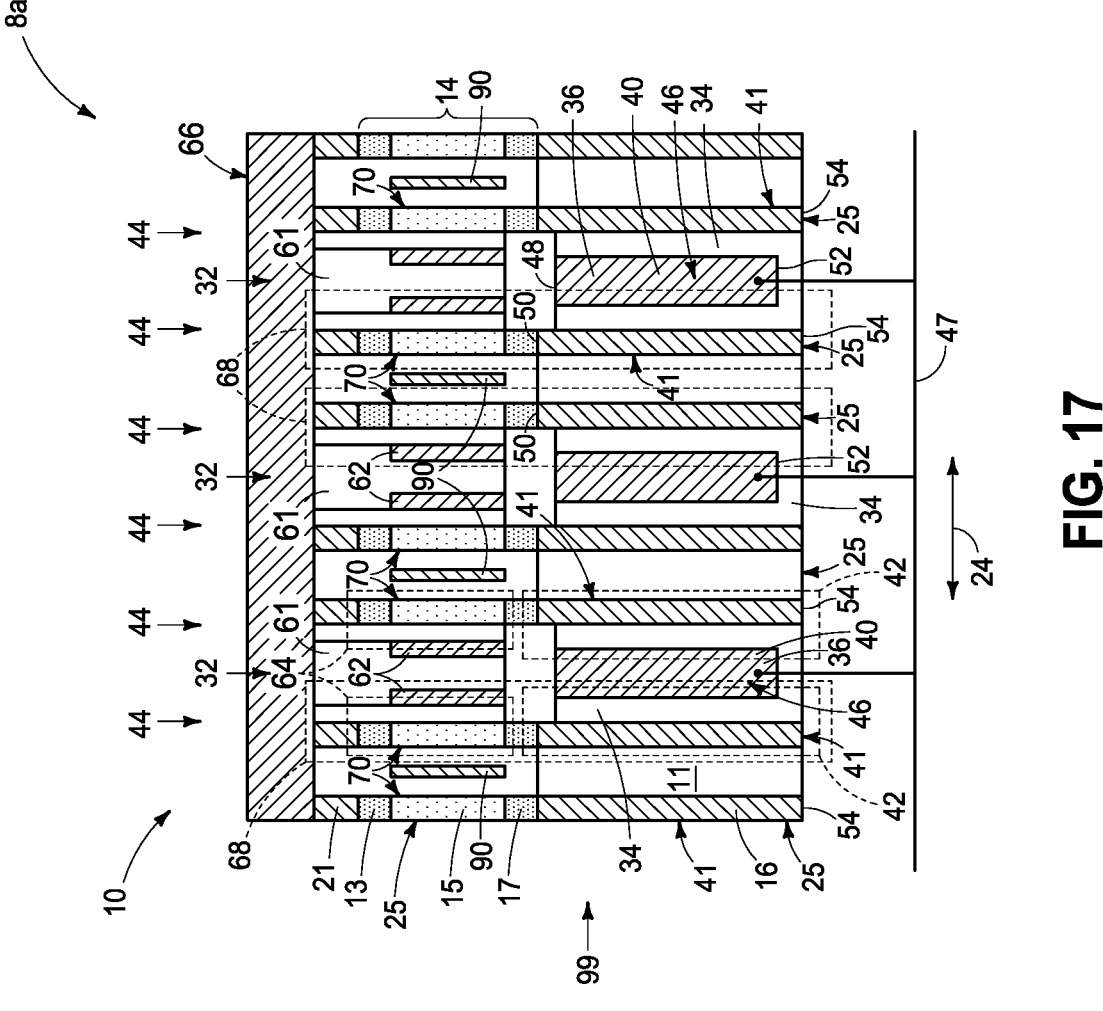

FIG. 17 shows an alternate embodiment construction 8a. Like numerals from the above-described embodiments have been used where appropriate, with some construction differences being indicated with the suffix "a" or with different numerals. Construction 8a comprises a conductive shield line 90 (e.g., held at a suitable potential [voltage] in operation) that may be used to reduce cross-talk and/or parasitic capacitance between immediately-laterally-adjacent vertical transistors 64. Example shield lines 90 may be formed by any manner. For example, after the processing shown by FIG. 13, processing could occur that includes a thin insulator deposition, then a thin metal deposition, then metal etch-back, and then an insulator deposition followed by planarizing thereof. Any other attribute(s) or aspect(s) as shown and/or described herein with respect to other embodiments may be used.

An alternate example method used in forming an array of memory cells is next described with reference to FIGS. 18-22 with respect to a construction 8*b*. Like numerals from the above-described embodiments have been used where appropriate, with some construction differences being indicated with the suffix "b" or with different numerals. FIGS. 18-22 are diagrammatic vertical cross-sectional views along column direction 24.

Figure 18:
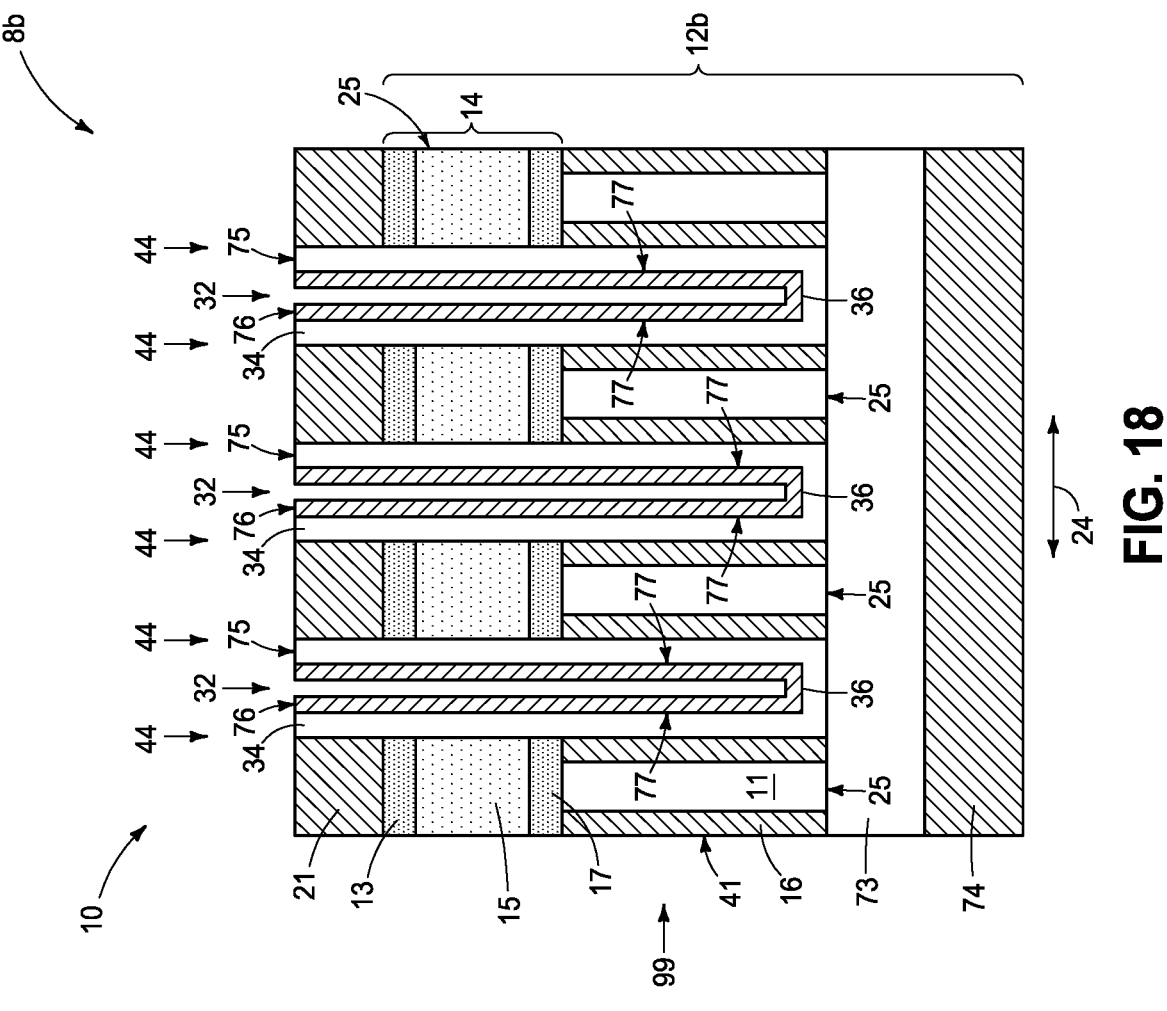

Referring to FIG. 18, such corresponds in processing sequence to that of FIG. 6. A vertical stack 12*b* has been formed that comprises transistor material 14 directly above insulator material 11 directly above insulating material 73 (e.g., silicon nitride if insulator material 11 is silicon dioxide) directly above conducting material 74. Pillars 25 have been formed above insulating material 73 and comprise transistor material 14 and first capacitor electrode material 16 (e.g., first capacitor electrodes 41). A first lining 75 comprising capacitor insulator 34 and a second lining 76 comprising second capacitor electrode material 36 have been formed in space that is laterally-between immediately-adjacent pillars 25 and less-than-fill such space. Second lining 76 may be considered as comprising sidewalls 77.

Figure 19:
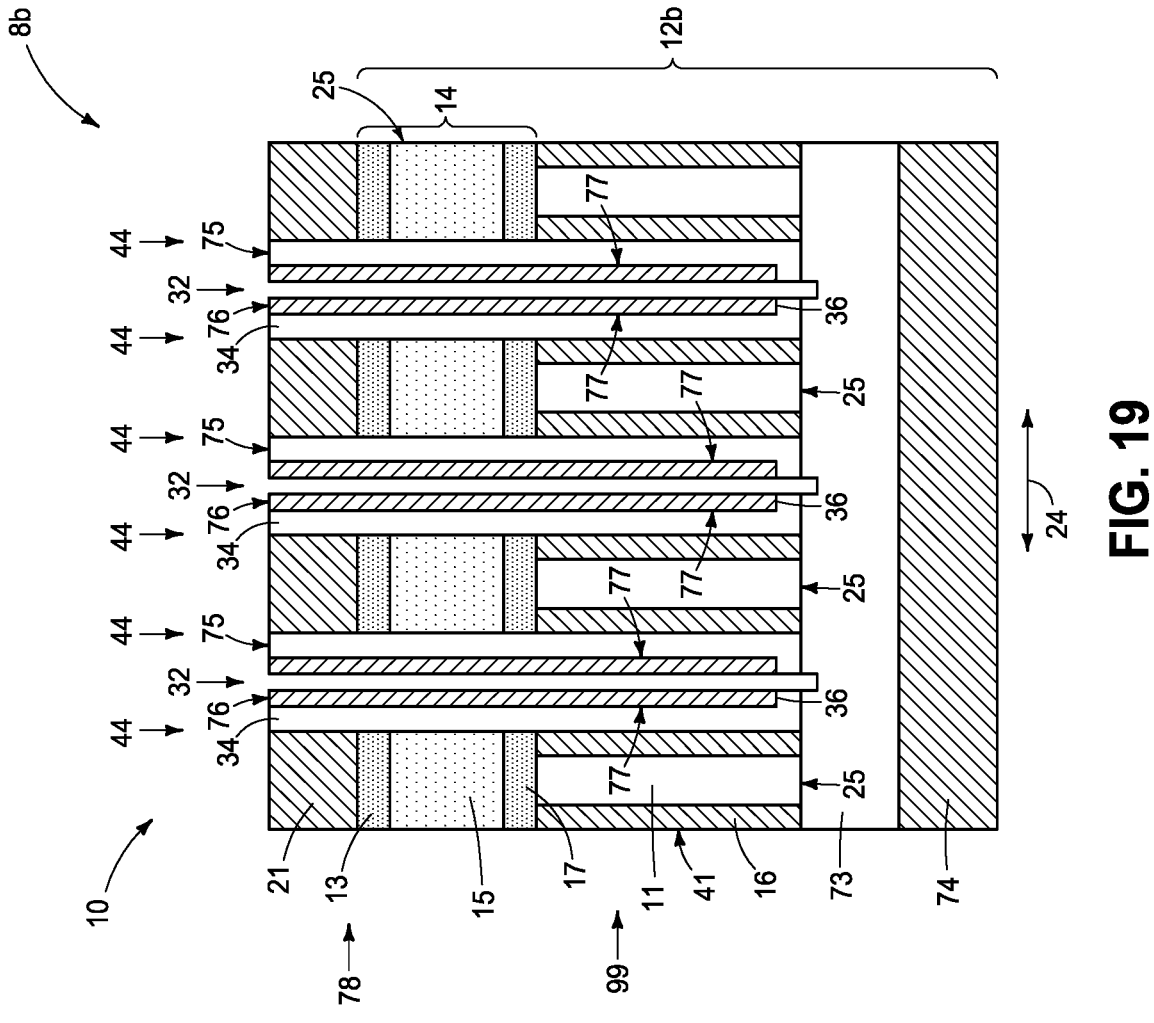
Figure 20:
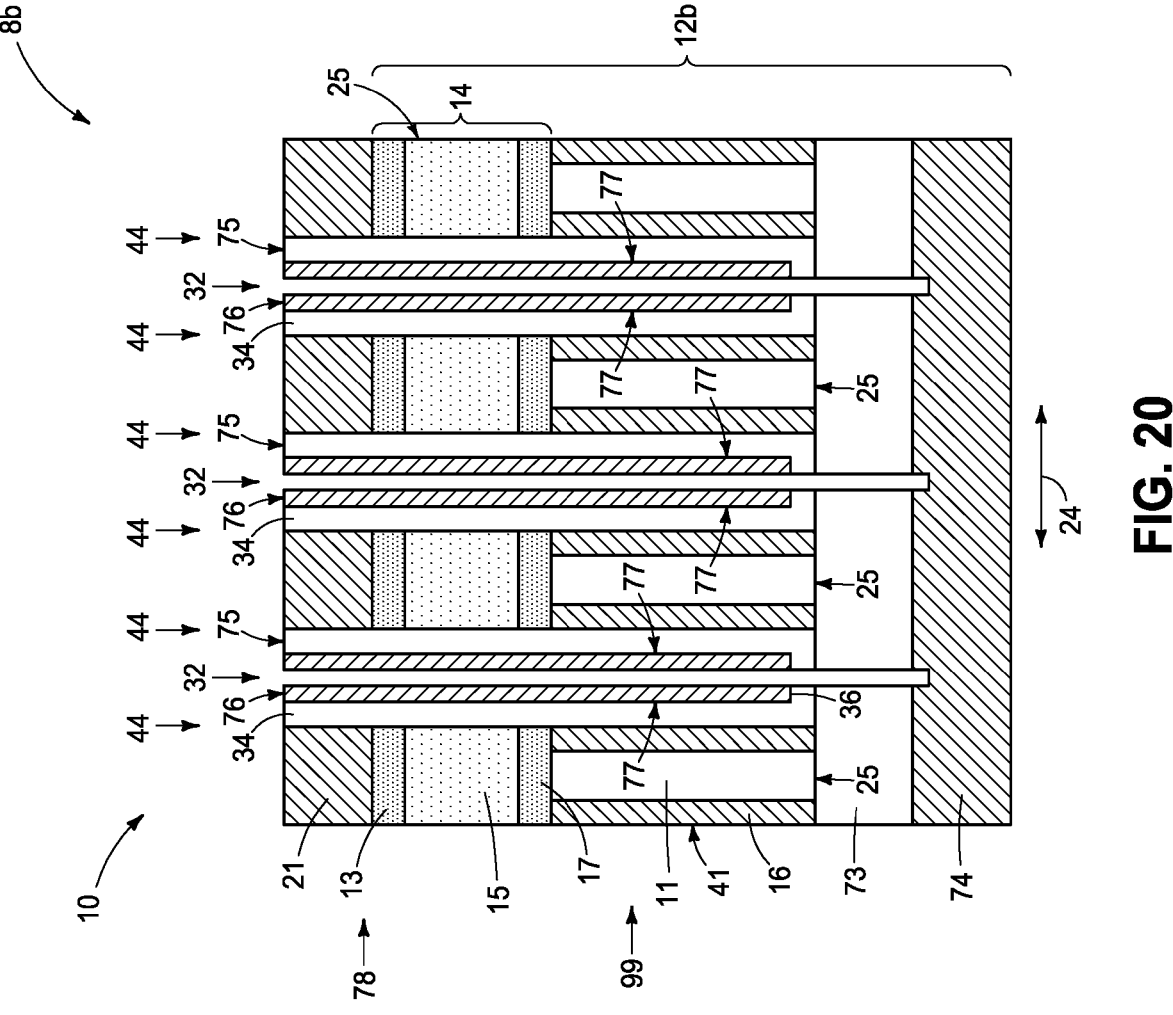

Referring to FIGS. 19 and then 20, opposing sidewalls 77 of second lining 76 have been used to comprise a mask 78 while etching through: (a) bottoms of first and second linings 75 and 76, respectively, that are laterally-between opposing sidewalls 77 of second linings 76, and (b) insulating material 73 to conducting material 74 there-below.

Figure 21:
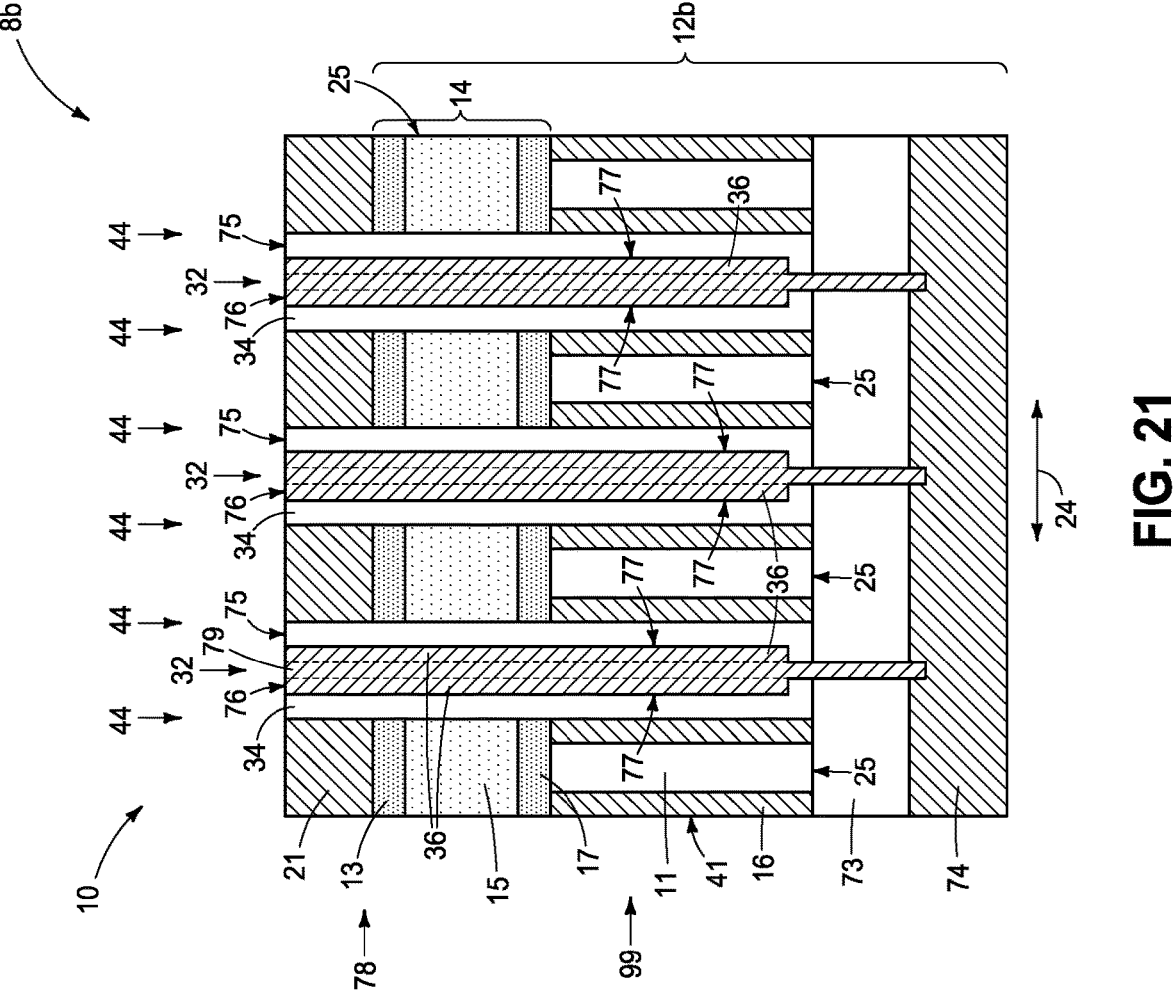

FIG. 21 shows subsequent forming of conductor material 79 (that may be of the same composition as material 36, and as exemplified by a dashed line there-between) directly against opposing sidewalls 77 of second lining 76 and directly against conducting material 74 to directly electrically couple together opposing sidewalls 77 of second lining 76 and conducting material 74. Individual capacitors are thereby formed which comprise first capacitor electrode material 16 of individual pillars 25, capacitor insulator 34, second capacitor electrode material 36, and conductor material 79. Conducting material 74 may comprise a common capacitor electrode plate or other structure that is common to all capacitors 42 within array 10.

Figure 22:
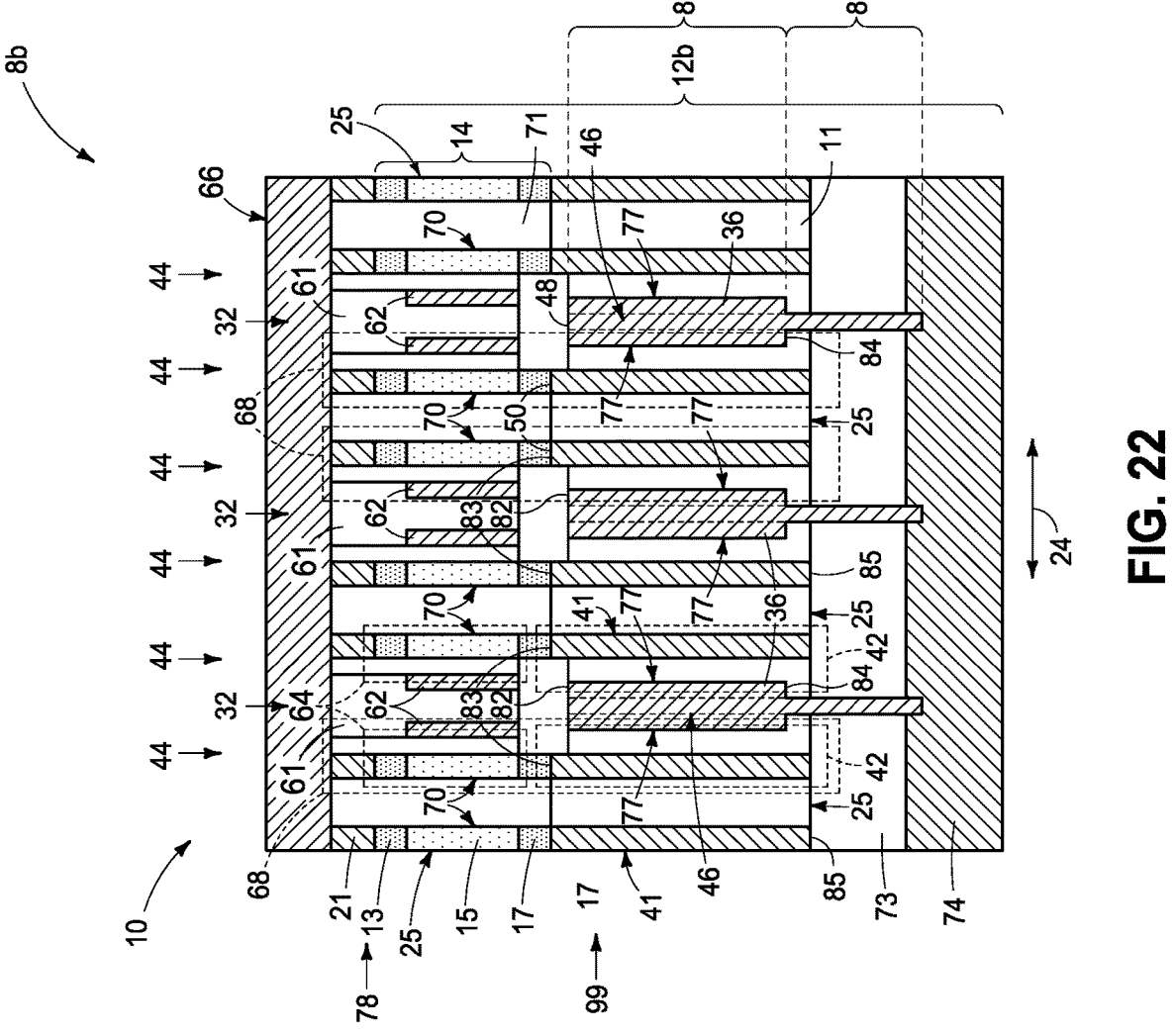

FIG. 22 shows an example final construction 8*b* corresponding to that of FIG. 16 with respect to the first-described embodiments. Vertical transistors 64 have been formed above capacitors 42 and individually comprise transistor material 14 of individual pillars 25. Such may occur, for example, by processing analogous to that shown and described above with respect to FIGS. 9-13, or otherwise. In one embodiment, where vertical transistors 64 are formed to comprise gate lines 62 that are above capacitors 42, the etching through the (a) and the (b) occurs before forming gate lines 62.

In one embodiment, second capacitor electrode material 36 and conductor material 79 are formed to comprise a plurality of conductive lines 46 that are individually longitudinally-elongated horizontally. Individual conductive lines 46 comprise a shared second capacitor electrode of immediately-laterally-adjacent capacitors 42 and interconnect individual second capacitor electrodes 40 longitudinally along individual conductive lines 46. In one such embodiment, individual conductive lines 46 comprise an upper part 80 that is wider than a lower part 81 in a vertical cross-section laterally through that individual conductive line 46 (e.g., FIG. 22). Lower part 81 extends through insulating material 73 and is directly against conducting material 74. In some such embodiments, tops 82 of wider upper parts 80 are below tops 83 of first capacitor electrodes 41. In some such embodiments, bottoms 84 of wider upper parts 80 are above bottoms 85 of first capacitor electrodes 41. In one embodiment, conductive lines 46 are directly electrically coupled together at least in part by conducting material 74.

Any other attribute(s) or aspect(s) as shown and/or described herein with respect to other embodiments may be used.

In one embodiment, a method used in forming an array (e.g., 10) of capacitors (e.g., 42) comprises forming a vertical stack (e.g., 12*b*) comprising insulating material (e.g., 73) directly above conducting material (e.g., 74). Pillars (e.g., 25) are formed above the vertical stack and individually comprise first capacitor electrode material (e.g., 16) aside insulator material (e.g., 11). A first lining (e.g., 75) comprising a capacitor insulator (e.g., 34) and a second lining (e.g., 76) comprising a second capacitor electrode material (e.g., 36) are formed in space that is laterally-between immediately-adjacent of the pillars to less-than-fill such space. Opposing sidewalls (e.g., 77) of the second lining is used to comprise a mask (e.g., 78) while etching through: (a) bottoms of the first and second linings that are laterally-between the opposing sidewalls of the first and second linings, and (b) the insulating material to the conducting material there-below. After the etching, conductor material (e.g., 79) is formed directly against the opposing sidewalls of the second lining and directly against the conducting material to directly electrically couple together the opposing sidewalls of the second lining and the conducting material. Individual of the capacitors comprise the first capacitor electrode material of individual of the pillars, the capacitor insulator, the second capacitor electrode material, and the conductor material. Any other attribute(s) or aspect(s) as shown and/or described herein with respect to other embodiments may be used.

Figure 24:
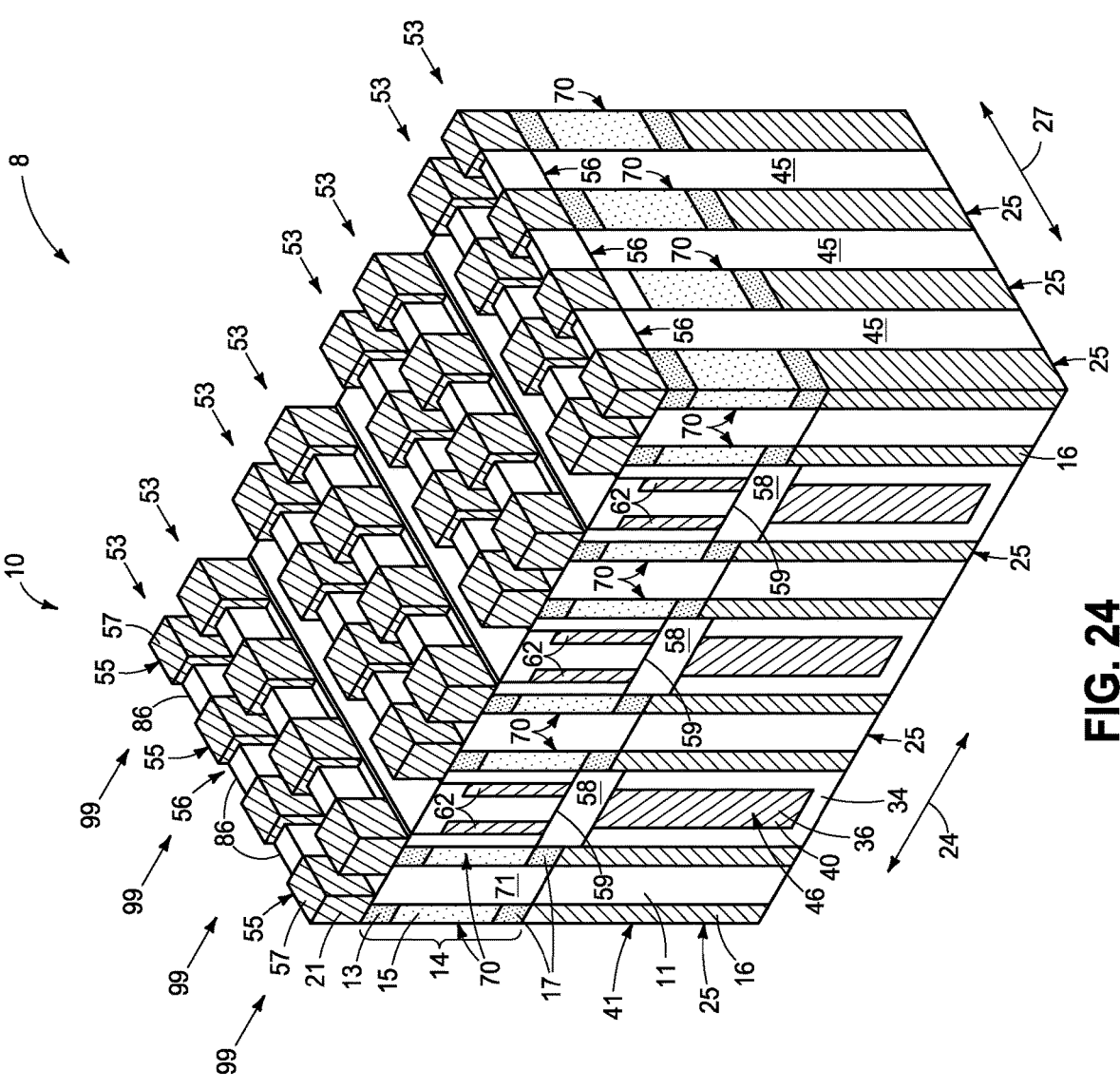
Figure 25:
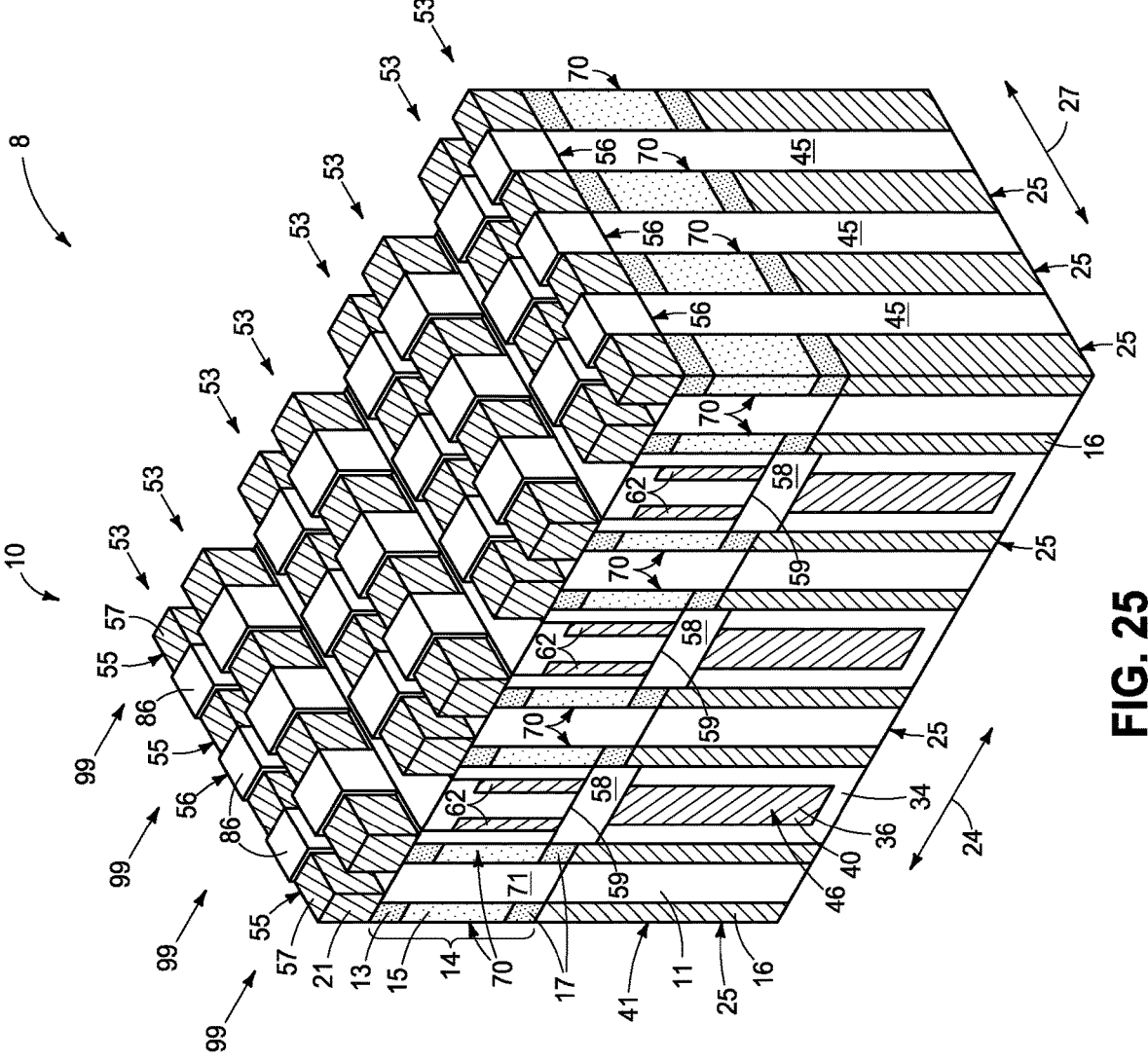
Figure 26:
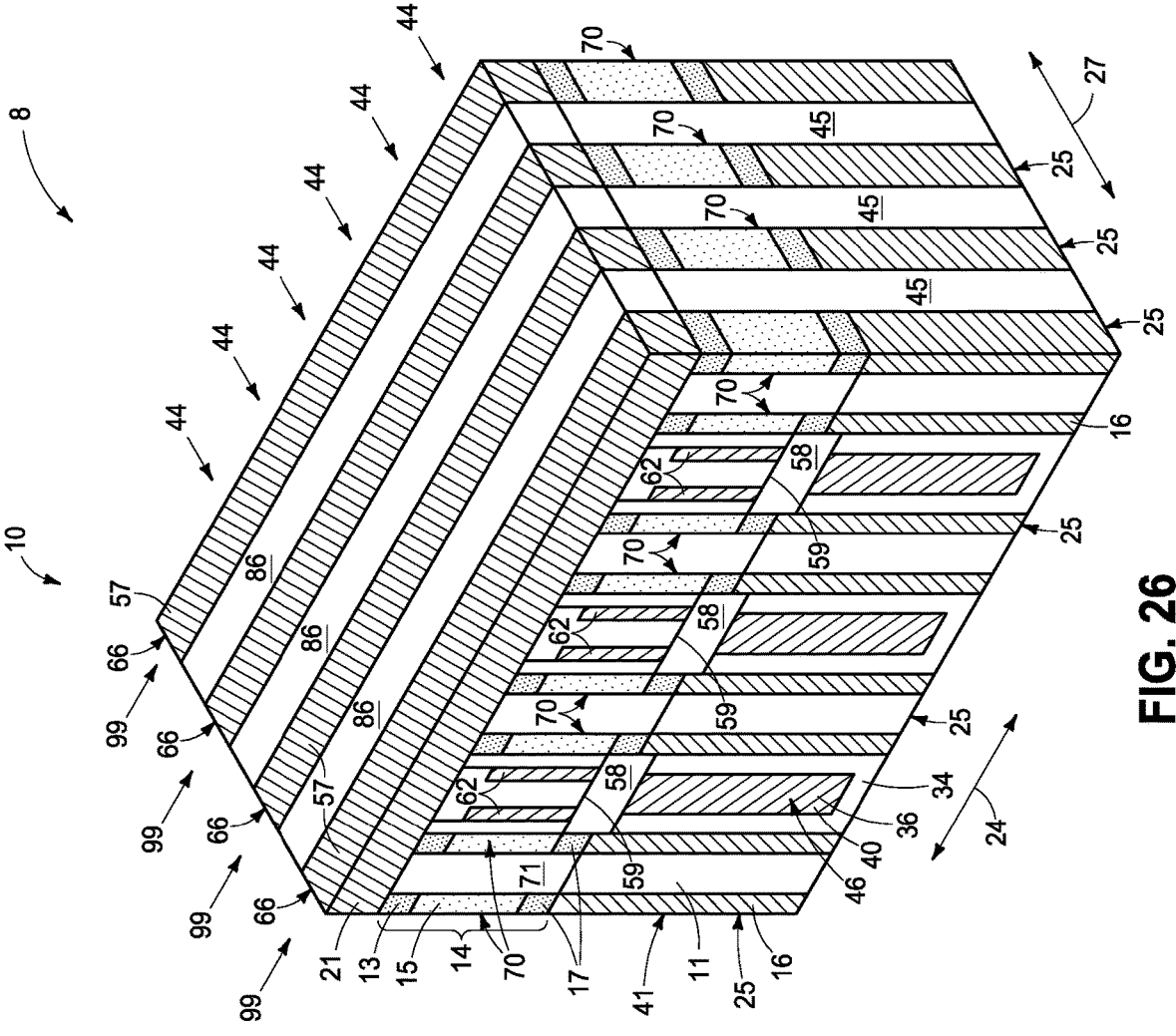

FIG. 23-26 show one example embodiment usable in forming digitlines 66 (FIG. 26). Such example methods described with respect to FIGS. 23-26 may also be used in forming a plurality of horizontally-spaced conductive lines regardless of whether being digitlines and regardless of underlying structure. Like numerals from the above-described embodiments have been used where appropriate, with some differences being indicated with different numerals.

Figure 23:
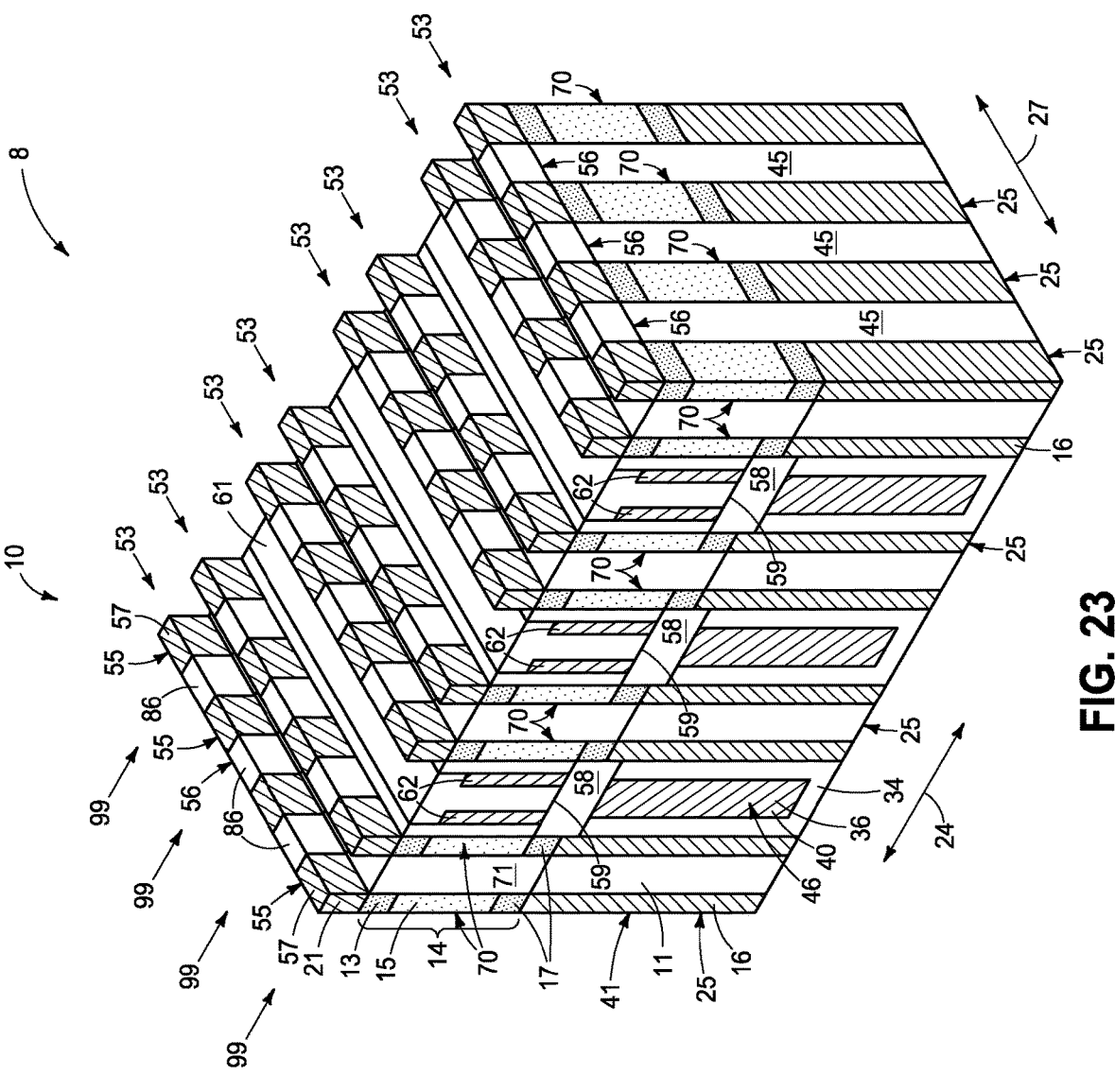

Referring to FIG. 23, such shows processing after that shown by FIG. 14 and alternate to that shown by FIG. 15. A plurality of horizontally-elongated lines 53 have been formed (e.g., atop and in one embodiment directly against upper source/drain region material 13) that individually comprise longitudinally alternating regions 55 and 56 of first material 57 and second material 86 that are of different compositions relative one another. At least one of first material 57 and second material 86 is conductive material. In the example embodiment, first regions 55 of first material 57 are directly above and directly against transistor material 14 and comprises conductive material (e.g., conductively-doped polysilicon or metal material). Second material 86 is insulative material (e.g., silicon dioxide or silicon nitride). In one embodiment and as shown, first-material regions 55 and second-material regions 56 abut one another.

This example method embodiment comprises alternately growing the first material from the first-material regions selectively relative to the second material of the second-material regions and the second material from the second-material regions selectively relative to the first material of the first-material regions at least until the conductive material of the at least one of the first and second materials of immediately-adjacent of the horizontally-elongated lines contacts one another to form digitlines that are individually directly above and directly electrically coupled to individual of the vertical transistors. The example processing proceeds with the alternately growing occurring first from the first-material regions and then from the second-material regions, although such could of course be reversed.

FIG. 24 shows example growing of conductive first material 57 from first-material regions 55 selectively relative to second material 86 of second-material regions 56. In one embodiment and as shown, such selective growing of first material 57 has occurred from both of tops and sides of first-material regions 55.

FIG. 25 shows example subsequent growing of second material 86 from second-material regions 56 selectively relative to first material 57 of first-material regions 55. In one embodiment and as shown, such selective growing of second material 86 has occurred from both of tops and sides of second-material regions 56.

FIG. 26 shows, by way of example only, continuing of such acts of alternately growing at least until conductive first material 57 of immediately-adjacent horizontally-elongated lines 53 contacts one another to form digitlines 66 that are individually directly above and directly electrically coupled to individual vertical transistors 64. Such has also optionally occurred with respect to second material 86 of second-material regions 56. Alternately, and by way of example only, such selective growing of second material 86 may not be completely conducted to a point of second material 86 of immediately-adjacent horizontally-elongated lines 53 contacting one another, but rather space there-between, for example, being subsequently filled with insulative material, for example to ultimately to form a construction like that shown in FIG. 26. Materials 86 and 57 may optionally be planarized back to reduce their respective thickness and/or to provide coplanar tops thereof as shown.

The artisan is capable of selecting suitable processes whereby selective growth of a conductive material occurs or selective growth of an insulative material occurs, and that may include activation or deactivation of surfaces so such can occur. For example, and by way of examples only, silicon dioxide can be selectively grown by an atomic layer deposition (ALD) process using chemoselective inhibitor molecules in a three-step (ABC-type) ALD cycle, for example using acetylacetone as an inhibitor (e.g., step A), bis(diethylamino)silane as a silicon-containing precursor (step B), and $O_2$ plasma as an oxygen containing co-reactant (e.g., step C) in ALD pulses. Cobalt can be selectively deposited using Co(bis(N,N0-diisopropylacetamidinato))$_2$ and ammonia. With respect to selective deposition of these and other conductive and insulative materials, see for example the following and references cited therein: Mackus et al., "The use of atomic layer deposition in advanced nanopatterning", Nanoscale, 2014, United Kingdom, pgs. 10941-10960; Mameli et al., "Area-Selective Atomic Layer Deposition of SiO$_2$ Using Acetylacetone as a Chemoselective Inhibitor in an ABC-Type Cycle", ACS Nano, 2017, United States, pgs. 9303-9311; Chen et al., "Chemistry for Positive Pattern Transfer Using Area-Selective Atomic Layer Deposition", Advanced Materials, 2016, United States, pgs. 1086-1090; Lee et al., "Area-Selective Atomic Layer Deposition of Lead Sulfide: Nanoscale Patterning and DFT Simulations", Langmuir, 2010, United States, pgs. 6845-6852; Lee et al., "High Quality Area-Selective Atomic Layer Deposition Co Using Ammonia Gas as a Reactant", Journal of The Electromechanical Society 157, 2010, United States, pgs. D10-D15; Kim, et al., "Atomic Layer Deposition of Ni Thin Films and Application to Area-Selective Deposition", Journal of The Electromechanical Society 158, 2011, United States, pgs. D1-D5; and Park et al., "Microcontact patterning of ruthenium gate electrodes by selective area atomic layer deposition", Applied Physics Letters 86, 2005, United States, pgs. 051903-1-051903-3.

Any other attribute(s) or aspect(s) as shown and/or described herein with respect to other embodiments may be used.

In one embodiment, a method used in forming a plurality of horizontally-spaced conductive lines (e.g., 66, and regardless whether such are digitlines) comprises forming a plurality of horizontally-elongated lines (e.g., 53) individually comprising longitudinally alternating regions (e.g., 55, 56) of first material (e.g., 57) and second material (e.g., 86) that are of different compositions relative one another. At least one of the first and second materials is conductive material. Alternately growing occurs of the first material from the first-material regions selectively relative to the second material of the second-material regions and the second material from the second-material regions selectively relative the first material of the first-material regions at least until the conductive material of the at least one of the first and second materials of immediately-adjacent of the horizontally-elongated lines contacts one another. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, an array (e.g., 10) of memory cells (e.g., 68) comprises insulating material (e.g., 73) directly above conducting material (e.g., 74). A plurality of capacitors (e.g., 42) is above the insulating material in rows (e.g., 44) along a row direction (e.g., 27) and in columns (e.g., 99) along a column direction (e.g., 24). The capacitors individually comprising a first capacitor electrode (e.g., 41), a second capacitor electrode (e.g., 40) laterally-outward of the first capacitor electrode, and a capacitor insulator (e.g., 34) between the first and second capacitor electrode. A plurality of vertical transistors (e.g., 64) is in the rows and columns above the plurality of capacitors. The vertical transistors individually comprise a top source/drain region (e.g., material 13), a bottom source/drain region (e.g., material 17), and a channel region (e.g., material 15) vertically there-between. Individual of the vertical transistors are directly electrically coupled to individual of the first capacitor electrodes. A plurality of gate lines (e.g., 62) is included and that are individually laterally-proximate the channel regions along individual of the rows. A plurality of digitlines (e.g., 66) is included and that are individually above the gate lines and are electrically coupled to the top source/drain regions along individual of the columns. A plurality of conductive lines is included and that are individually longitudinally-elongated in and extend along the row direction aside and are directly against the capacitor insulator and that are below the gate lines. Individual of the conductive lines comprise the second capacitor electrode of individual of the capacitors. The individual conductive lines comprise a shared of the second capacitor electrodes of immediately-row-adjacent of the capacitors and interconnect the individual second capacitor electrodes longitudinally along immediately-adjacent of the rows. The individual conductive lines comprising an upper part (e.g., 80) that is wider than a lower part (e.g., 81) in a vertical cross-section (e.g., that of FIG. 22) laterally through that individual conductive line. The lower part extends through the insulating material and is directly against the conducting material. Any other attribute(s) or aspect(s) as shown and/or described herein with respect to other embodiments may be used.

In one embodiment, an array (e.g., 10) of capacitors (e.g., 42) comprises insulating material (e.g., 73) directly above conducting material (e.g., 74). A plurality of capacitors (e.g., 42) individually comprise a first capacitor electrode (e.g., 41), a second capacitor electrode (e.g., 40) laterally-outward of the first capacitor electrode, and a capacitor insulator (e.g., 34) between the first capacitor electrode and the second capacitor electrode. A plurality of conductive lines (e.g., 46) are individually longitudinally-elongated horizontally and extend alongside and are directly against the capacitor insulator. Individual of the conductive lines comprise the second capacitor electrode of individual of the capacitors. The individual conductive lines comprise a shared of the second capacitor electrodes of immediately-laterally-adjacent of the capacitors and interconnect the individual second capacitor electrodes longitudinally along the individual conductive lines. The individual conductive lines comprising an upper part (e.g., 80) that is wider than a lower part (e.g., 81) in a vertical cross-section (e.g., that of FIG. 22) laterally through that individual conductive line. The lower part extends through the insulating material and is directly against the conducting material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Herein, "self-aligned" or "self-aligning" means a technique whereby at least a lateral surface of a later-formed structure is defined by deposition of material against a sidewall of a previously-formed structure thereby not requiring subsequent photolithographic or other processing with respect to the lateral surface of the later-formed structure.

Unless otherwise indicated, use of "or" herein encompasses either and both.

CONCLUSION

In some embodiments, a method used in forming an array of memory cells comprises forming a vertical stack comprising transistor material directly above insulator material. A mask is used to subtractively etch both the transistor material and thereafter the insulator material to form a plurality of pillars that individually comprise the transistor material and the insulator material. The insulator material is laterally-recessed from opposing lateral sides of individual of the pillars selectively relative to the transistor material of the individual pillars. The individual pillars are formed to comprise a first capacitor electrode that is in void space formed from the laterally recessing. Capacitors are formed that individually comprise the first capacitor electrode of the individual pillars. A capacitor insulator is aside the first capacitor electrode of the individual pillars and a second capacitor electrode is laterally-outward of the capacitor insulator. Vertical transistors are formed above the capacitors and individually comprise the transistor material of the individual pillars.

In some embodiments, a method used in forming an array of capacitors comprises forming a vertical stack comprising insulating material directly above conducting material. Pillars are formed above the vertical stack and that individually comprise first capacitor electrode material aside the insulator material. A first lining comprising a capacitor insulator and a second lining comprising a second capacitor electrode material are formed in the space that is laterally-between immediately-adjacent of the pillars to less-than-fill such space. Opposing sidewalls of the second lining are used to comprise a mask while etching through: (a) bottoms of the first and second linings that are laterally-between the opposing sidewalls of the first and second linings, and (b) the insulating material to the conducting material there-below. After the etching, conductor material is formed directly against the opposing sidewalls of the second lining and directly against the conducting material to directly electrically couple together the opposing sidewalls of the second lining and the conducting material. Individual of the capacitors comprise the first capacitor electrode material of individual of the pillars, the capacitor insulator, the second capacitor electrode material, and the conductor material.

In some embodiments, a method used in forming an array of memory cells comprises forming a vertical stack comprising transistor material directly above insulator material directly above insulating material directly above conducting material. Pillars are formed above the insulating material. The pillars comprise the transistor material and the first capacitor electrode material. A first lining comprising a capacitor insulator and a second lining comprising a second capacitor electrode material are formed in the space that is laterally-between immediately-adjacent of the pillars to less-than-fill such space. Opposing sidewalls of the second lining are used to comprise a mask while etching through: (a) bottoms of the first and second linings that are laterally-between the opposing sidewalls of the second lining, and (b) the insulating material to the conducting material therebelow. After the etching, conductor material is formed directly against the opposing sidewalls of the second lining and directly against the conducting material to directly electrically couple together the opposing sidewalls of the second lining and the conducting material. Individual of the capacitors comprise the first capacitor electrode material of individual of the pillars, the capacitor insulator, the second capacitor electrode material, and the conductor material. Vertical transistors are formed above the capacitors and that individually comprise the transistor material of the individual pillars.

In some embodiments, a method used in forming a plurality of horizontally-spaced conductive lines comprises forming a plurality of horizontally-elongated lines that individually comprise longitudinally alternating regions of first material and second material that are of different compositions relative one another. At least one of the first and second materials is conductive material. The first material from the first-material regions is alternately grown selectively relative to the second material of the second-material regions and the second material from the second-material regions selectively relative the first material of the first-material regions at least until the conductive material of the at least one of the first and second materials of immediately-adjacent of the horizontally-elongated lines contacts one another.

In some embodiments, an array of capacitors comprises insulating material directly above conducting material. A plurality of capacitors individually comprise a first capacitor electrode, a second capacitor electrode laterally-outward of the first capacitor electrode, and a capacitor insulator between the first capacitor electrode and the second capacitor electrode. A plurality of conductive lines that are individually longitudinally-elongated horizontally and extend alongside and are directly against the capacitor insulator. Individual of the conductive lines comprise the second capacitor electrode of individual of the capacitors. The individual conductive lines comprise a shared of the second capacitor electrodes of immediately-laterally-adjacent of the capacitors and interconnect the individual second capacitor electrodes longitudinally along the individual conductive lines. The individual conductive lines comprise an upper part that is wider than a lower part in a vertical cross-section laterally through that individual conductive line. The lower part extends through the insulating material and is directly against the conducting material.

In some embodiments, an array of memory cells comprises insulating material directly above conducting material. A plurality of capacitors is above the insulating material in rows along a row direction and in columns along a column direction. The capacitors individually comprise a first capacitor electrode, a second capacitor electrode laterally-outward of the first capacitor electrode, and a capacitor insulator between the first and second capacitor electrode. A plurality of vertical transistors is in the rows and columns above the plurality of capacitors. The vertical transistors individually comprise a top source/drain region, a bottom source/drain region, and a channel region vertically therebetween. Individual of the vertical transistors is directly electrically coupled to individual of the first capacitor electrodes. A plurality of gate lines that are individually laterally proximate the channel regions is along individual of the rows. A plurality of digitlines that are individually above the gate lines and electrically coupled to the top source/drain regions is along individual of the columns. A plurality of conductive lines that are individually longitudinally-elongated in and extend along the row direction aside and are directly against the capacitor insulator and that are below the gate lines. Individual of the conductive lines comprise the second capacitor electrode of individual of the capacitors. The individual conductive lines comprise a shared of the second capacitor electrodes of immediately-row-adjacent of the capacitors and interconnect the individual second capacitor electrodes longitudinally along immediately-adjacent of the rows. The individual conductive lines comprise an upper part that is wider than a lower part in a vertical cross-section laterally through that individual conductive line. The lower part extends through the insulating material and is directly against the conducting material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of capacitors comprising:
insulating material directly above conducting material;
a plurality of capacitors individually comprising a first capacitor electrode, a second capacitor electrode laterally-outward of the first capacitor electrode, and a capacitor insulator between the first capacitor electrode and the second capacitor electrode; and
a plurality of conductive lines that are individually longitudinally-elongated horizontally and extend alongside and are directly against the capacitor insulator, individual of the conductive lines comprising the second capacitor electrode of individual of the capacitors, the individual conductive lines comprising a shared of the second capacitor electrodes of immediately-laterally-adjacent of the capacitors and interconnecting the individual second capacitor electrodes longitudinally along the individual conductive lines, the individual conductive lines comprising an upper part that is wider than a lower part in a vertical cross-section laterally through that individual conductive line, the lower part extending through the insulating material and being directly against the conducting material.

2. The array of claim 1 wherein tops of the wider upper parts are below tops of the first capacitor electrodes.

3. The array of claim 1 wherein bottoms of the wider upper parts are above bottoms of the first capacitor electrodes.

4. The array of claim 1 wherein tops of the wider upper parts are below tops of the first capacitor electrodes and bottoms of the wider upper parts are above bottoms of the first capacitor electrodes.

5. The array of claim 1 wherein the conductive lines are directly electrically coupled together at least in part by the conducting material.

\* \* \* \* \*